US012575277B2

(12) United States Patent
Qu et al.

(10) Patent No.: US 12,575,277 B2
(45) Date of Patent: Mar. 10, 2026

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Yi Qu, Beijing (CN); Zhiwen Chu, Beijing (CN); Xinxin Wang, Beijing (CN); Aoyuan Feng, Beijing (CN); Yang Zhou, Beijing (CN); Lu Bai, Beijing (CN); Junxiu Dai, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 388 days.

(21) Appl. No.: 18/033,341

(22) PCT Filed: Jun. 29, 2022

(86) PCT No.: PCT/CN2022/102496
§ 371 (c)(1),
(2) Date: Apr. 23, 2023

(87) PCT Pub. No.: WO2024/000309
PCT Pub. Date: Jan. 4, 2024

(65) Prior Publication Data
US 2024/0381711 A1 Nov. 14, 2024

(51) Int. Cl.
*H10K 59/131* (2023.01)
(52) U.S. Cl.
CPC .................................. *H10K 59/131* (2023.02)

(58) Field of Classification Search
None
See application file for complete search history.

(56) References Cited

U.S. PATENT DOCUMENTS

2019/0067409 A1 2/2019 Shin et al.
2020/0203336 A1 6/2020 Ren et al.
(Continued)

FOREIGN PATENT DOCUMENTS

CN 106783842 A 5/2017
CN 107219660 A 9/2017
(Continued)

OTHER PUBLICATIONS

European Search Report for 22948424.1 Mailed Nov. 27, 2024.

*Primary Examiner* — William C Trapanese
(74) *Attorney, Agent, or Firm* — Ling Wu; Stephen Yang; Ling and Yang Intellectual Property

(57) ABSTRACT

A display substrate and a display apparatus. The display substrate includes an electrostatic discharge protection circuit, a power supply line, and at least one auxiliary electrode. The electrostatic discharge protection circuit includes multiple electrostatic discharge protection units, at least one of which extends along a first inclined direction, there is a first preset included angle between the first inclined direction and a first direction, the first direction is an extension direction of a scan signal line in the display region, the first preset included angle is greater than 0° and less than 90°; the first trace region includes the power supply line and at least one auxiliary electrode, an orthographic projection of the at least one auxiliary electrode on a display substrate plane is overlapped with that of the power supply line on the display substrate plane, the at least one auxiliary electrode is connected with the power supply line.

20 Claims, 18 Drawing Sheets

(56)         References Cited

U.S. PATENT DOCUMENTS

| | | | |
|---|---|---|---|
| 2020/0212115 A1 | 7/2020 | Choi et al. | |
| 2021/0201736 A1 | 7/2021 | You et al. | |
| 2022/0077273 A1 | 3/2022 | Qing et al. | |
| 2022/0180784 A1* | 6/2022 | Liu ..................... | H10D 89/931 |
| 2022/0320851 A1 | 10/2022 | Cai et al. | |
| 2023/0247871 A1 | 8/2023 | Zhou et al. | |

FOREIGN PATENT DOCUMENTS

| | | | |
|---|---|---|---|
| CN | 110085118 A | 8/2019 | |
| CN | 111029378 A | 4/2020 | |
| CN | 111384135 A | 7/2020 | |
| CN | 111599847 A | 8/2020 | |
| CN | 111681554 A | 9/2020 | |
| CN | 111863916 A | 10/2020 | |
| CN | 213042915 U | 4/2021 | |
| CN | 112838106 A | 5/2021 | |
| CN | 113053288 A | 6/2021 | |

* cited by examiner

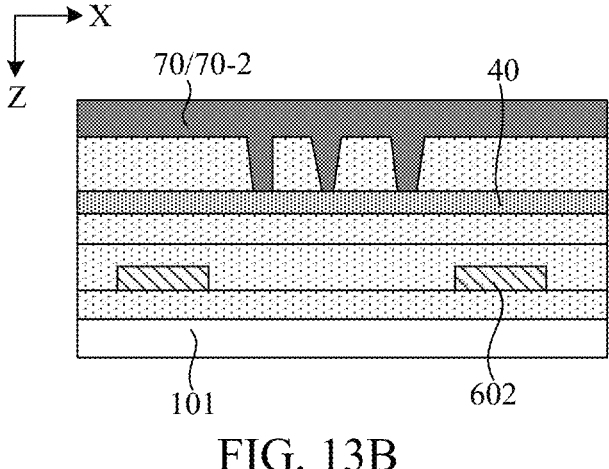
FIG. 13B
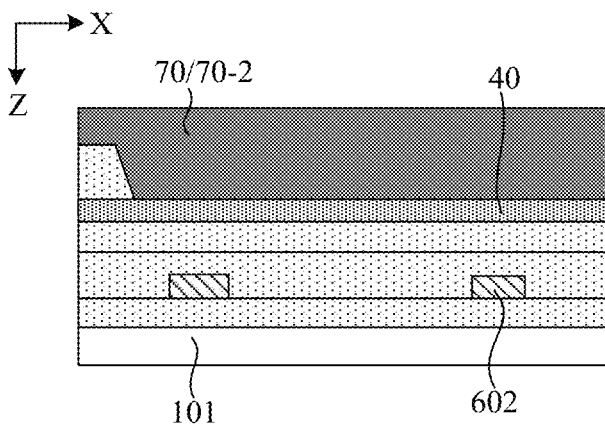
FIG. 13C
FIG. 14

DISPLAY SUBSTRATE AND DISPLAY APPARATUS

CROSS-REFERENCE TO RELATED APPLICATION

The present application is a U.S. National Phase Entry of International Application No. PCT/CN2022/102496 having an international filing date of Jun. 29, 2022, the content of which is incorporated into this application by reference.

TECHNICAL FIELD

Embodiments of the present disclosure relate to, but are not limited to, the field of display technologies, and particularly to a display substrate and a display apparatus.

BACKGROUND

In a preparation process of a display substrate (such as an array substrate), Electrostatic discharge (ESD) is easy to occur on the display substrate, which causes damage to traces or circuits on the display substrate. Therefore, in order to avoid ESD damage, an ESD protection unit is usually disposed on the display substrate.

SUMMARY

The following is a summary of subject matters described herein in detail. The summary is not intended to limit the protection scope of claims.

In one aspect, an embodiment of the present disclosure provides a display substrate. The display substrate includes a display region and a non-display region located on a periphery of the display region, wherein the non-display region includes a composite circuit region, and a first trace region located on a side of the composite circuit region away from the display region; the composite circuit region includes an electrostatic discharge protection circuit, the electrostatic discharge protection circuit includes multiple electrostatic discharge protection units, at least one electrostatic discharge protection unit in the multiple electrostatic discharge protection units extends along a first inclined direction, there is a first preset included angle between the first inclined direction and a first direction, the first preset included angle is greater than 0° and less than 90°, and the first direction is an extension direction of a scan signal line in the display region; the first trace region includes a power supply line and at least one auxiliary electrode, an orthographic projection of the at least one auxiliary electrode on a plane of the display substrate is overlapped with an orthographic projection of the power supply line on the plane of the display substrate, and the at least one auxiliary electrode is connected with the power supply line.

In another aspect, an embodiment of the present disclosure also provides a display apparatus, including: the display substrate in the aforementioned embodiment.

Other characteristics and advantages of the present disclosure will be set forth in the following specification, and moreover, partially become apparent from the specification or are understood by implementing the present disclosure. Other advantages of the present disclosure may be achieved and obtained through solutions described in the specification and drawings.

Other aspects may be understood upon reading and understanding the drawings and detailed description.

BRIEF DESCRIPTION OF DRAWINGS

The drawings are used for providing understanding of technical solutions of the present disclosure, constitute a part of the specification, and together with the embodiments of the present disclosure, are used for explaining the technical solutions of the present disclosure but do not form limitations on the technical solutions of the present disclosure. Shapes and sizes of each component in the drawings do not reflect actual scales, and are only intended to schematically illustrate contents of the present disclosure.

FIG. 13B is a schematic diagram of a cross-sectional view of a structure along the BB' direction in FIG. 11.

FIG. 13C is a schematic diagram of a cross-sectional view of a structure along the BB' direction in FIG. 12.

FIG. 14 is a schematic diagram of an equivalent circuit of an ESD protection unit in an exemplary embodiment of the present disclosure.

DETAILED DESCRIPTION

Figure 1:
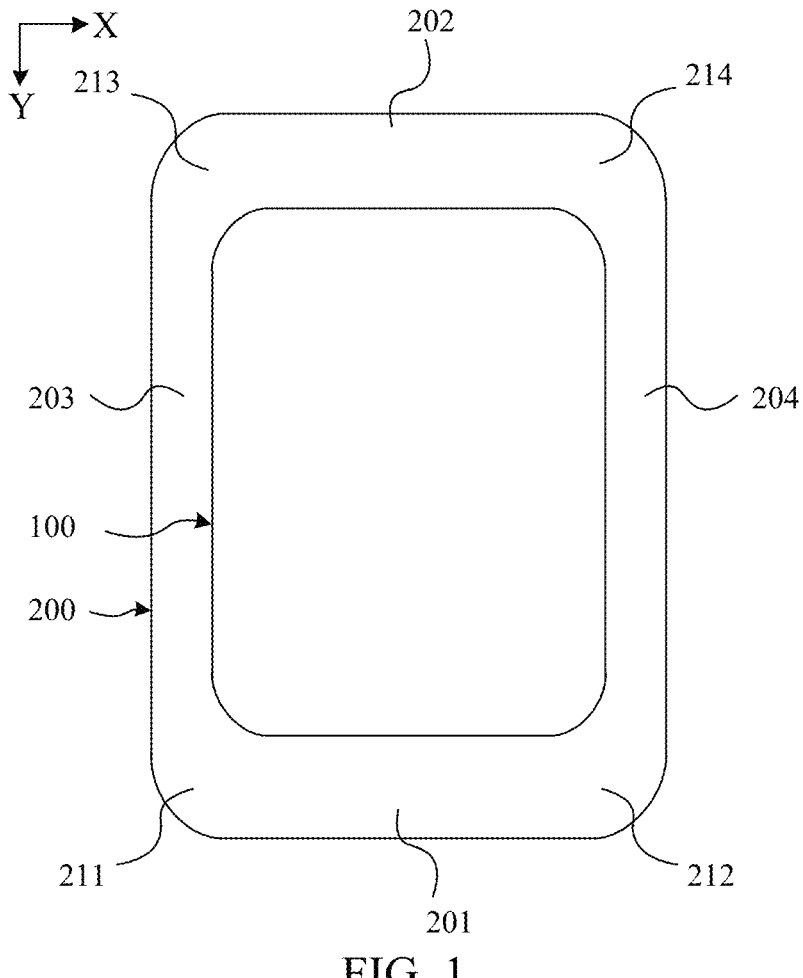
FIG. 1 is a schematic diagram of a contour of a display apparatus.

Many embodiments are described herein, but the description is exemplary rather than restrictive, and there may be more embodiments and implementation solutions within the scope contained in the embodiments described herein. Although many possible feature combinations are shown in the drawings and discussed in exemplary implementations, many other combinations of the disclosed features are possible. Unless expressly limited, any feature or element of any embodiment may be used in combination with, or may replace, any other feature or element in any other embodiment.

When a representative embodiment is described, a method or process may have already been presented in a specific sequence of acts in the specification. However, to an extent that the method or process does not depend on a specific sequence of the acts herein, the method or process should not be limited to the acts in the specific sequence. As will be understood by those of ordinary skill in the art, other act orders are possible. Therefore, the specific order of the acts illustrated in the specification should not be interpreted as a limitation on claims. In addition, the claims with respect to the method or process should not be limited to execute their acts according to the written sequence. Those skilled in the art may easily understand that these sequences may change, and are still maintained in the spirit and scope of the embodiments of the disclosure.

Scales of the drawings in the present disclosure may be used as a reference in the actual process, but are not limited thereto. For example, the width-length ratio of the channel, the thickness and spacing of each film layer, and the width and spacing of each signal line may be adjusted according to actual needs. The number of pixels in the display substrate and the number of sub-pixels in each pixel are not limited to the numbers shown in the drawings. The drawings described in the present disclosure are schematic structure diagrams only, and one implementation of the present disclosure is not limited to the shapes, numerical values or the like shown in the drawings.

Ordinal numerals such as "first", "second", and "third" in the specification are set to avoid confusion of constituent elements, but not to set a limit in quantity.

In the specification, for convenience, expressions indicating orientation or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element has a particular orientation and is structured and operated in the particular orientation. Therefore, they cannot be understood as limitations on the present disclosure. The positional relationships between the constituent elements may be changed as appropriate according to a direction which is used for describing each constituent element. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, or a detachable connection, or an integrated connection. It may be a mechanical connection or an electrical connection. It may be a direct mutual connection, or an indirect connection through middleware, or internal communication between two components. Those of ordinary skills in the art may understand meanings of the above-mentioned terms in the present disclosure according to situations.

In the specification, "electrical connection" includes a case that constituent elements are connected together through an element with a certain electrical effect. The "element with a certain electrical effect" is not particularly limited as long as electrical signals may be sent and received between the connected constituent elements. For example, "the element with a certain electrical effect" may be an electrode or wiring, or a switch element, such as a transistor, or other functional elements, such as a resistor, an inductor, a capacitor, or the like.

In the specification, a transistor refers to an element that at least includes three terminals, i.e., a gate electrode (gate or control electrode), a drain electrode (drain electrode terminal, drain region, or drain), and a source electrode (source electrode terminal, source region, or source). A transistor has a channel region between a drain electrode and a source electrode, and a current can flow through the drain electrode, the channel region, and the source electrode. It is to be noted that, in the specification, the channel region refers to an region through which the current mainly flows.

In the specification, in order to distinguish two electrodes of a transistor other than a gate electrode (gate electrode or control electrode), one of the two electrodes is directly described as a first electrode, while the other is described as a second electrode. The first electrode may be a drain electrode, and the second electrode may be a source electrode. Or, the first electrode may be a source electrode, and the second electrode may be a drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

Transistors in embodiments of the present disclosure may be Thin Film Transistors (TFTs), or Field Effect Transistors (FETs), or other devices with same characteristics. For example, a thin film transistor used in embodiments of the present disclosure may include, but is not limited to, an oxide TFT or a Low Temperature Poly-silicon TFT (LTPS TFT). Here, no limitation is made thereto in an embodiment of the present disclosure.

In the specification, "parallel" refers to a state in which an angle formed by two straight lines is −10° or more than −10° and 10° or lower than 10°, and thus also includes a state in which the angle is −5° or more than −5° and 5° or lower than 5°. In addition, "perpendicular" refers to a state in which an angle formed by two straight lines is 80° or more than 80° and 100° or less than 100°, and thus also includes a state in which the angle is 85° or more than 85° and 95° or more than 95°.

In the specification, a "film" and a "layer" are interchangeable. For example, a "conductive layer" may be replaced with a "conductive film" sometimes. Similarly, an "insulation film" may be replaced with an "insulation layer" sometimes.

Triangle, rectangle, trapezoid, pentagon and hexagon in this specification are not strictly defined, and they may be approximate triangle, rectangle, trapezoid, pentagon or hexagon, etc. There may be some small deformation caused by tolerance, and there may be chamfer, arc edge and deformation, etc.

In the present disclosure, "about" refers to that a boundary is defined not so strictly and numerical values within process and measurement error ranges are allowed.

In this specification, "being disposed in a same layer" is referred to a structure formed by patterning two (or more than two) structures through the same patterning process, and their materials may be the same or different. For example, the materials of the precursors forming multiple structures disposed in a same layer are the same, and the resulting materials may be the same or different.

An "integral structure" in embodiments of the present disclosure may refer to a structure formed by two (or more) structures which are formed by a same deposition process and are patterned by a same patterning process so as to connect to each other, and their materials may be the same or different.

In an embodiment of the present disclosure, a first direction X may refer to an extension direction of a scan signal line in a display region or a horizontal direction, a second direction Y may refer to an extension direction of a data signal line in the display region or a vertical direction, and a third direction Z may refer to a direction perpendicular to a plane of a display substrate or a thickness direction of a display substrate, etc. Herein, the first direction X and the second direction Y may be perpendicular to each other, and the first direction X and the third direction Z may be perpendicular to each other.

In order to facilitate better understanding of technical solutions of the present disclosure by those skilled in the art, technical terms that may be involved in exemplary embodiments of the present disclosure are briefly described below.

Electrostatic discharge (ESD) refers to charge transfer caused by approaching or directly contacting each other of objects with different electrostatic charge potentials, simply speaking, it is a phenomenon that a process of charge transfer is produced since an electrostatic charge moves from one object to another object instantaneously, that is, electrostatic charge transfer between objects or surfaces with different electrostatic potentials (potential difference).

Gate Driver on Array (GOA) technology refers to a technology by which a drive circuit used to control the gate (Gate) of the thin film transistor (TFT) is integrated on the array substrate of the display panel through the thin film transistor process, so as to reduce a cost of the drive circuit of the control gate in the panel and realize a narrow bezel of the panel. For example, a gate drive circuit (GOA) refers to a drive circuit that controls a gate and may include multiple cascaded GOA units, and a GOA unit may be constructed in a form of a shift register. For example, according to the function of GOA units, the GOA units may be divided into: a Gate (Gate) GOA unit, an Emission (EM) GOA unit, a Reset (RS) GOA unit, and the like, wherein the Gate GOA unit is configured to provide a scan signal to a pixel drive circuit in a sub-pixel, the EM GOA unit is configured to provide a light-emitting control signal to the pixel drive circuit in the sub-pixel, and the Reset GOA unit is configured to provide a reset control signal to the pixel drive circuit in the sub-pixel. Correspondingly, a Gate signal provided by the GOA unit may include a scan signal, a light-emitting control signal, a reset control signal, or the like. For example, depending on the type of transistor, the Gate GOA unit may include a Gate GOA N (GN) unit or a Gate GOA P (GP) unit, the Gate GOA N (GN) unit is configured to provide a scan signal to an N-type transistor in the pixel drive circuit in the sub-pixel, or the Gate GOA P (GP) unit is configured to provide a scan signal to a P-type transistor in the pixel drive circuit in the sub-pixel.

With development of display technology, "screen ratio" has become a relatively important performance parameter of a display product. According to consumers' pursuits of portability, a viewing angle effect, and the like of the display products, a high resolution, a narrow bezel, and even a full-screen display become a new trend of development of the display product, so narrowing of a bezel has been paid more and more attention in a design of the display product. With the continuous narrowing of the bezel of the display product, requirements for the reliability, stability and uniformity of a display product are getting higher and higher.

FIG. 1 is a schematic diagram of a contour of a display apparatus. As shown in FIG. 1, the display apparatus may include a display region 100, and a non-display region 200 located on the periphery of the display region 100, and the non-display region 200 at least partially surrounds the display region 100. The display region 100 may also be referred to as an Active Area (AA). Here, an illustration is made in FIG. 1 by taking a case in which both a contour of the display region 100 and a contour of the non-display region are a rectangular shape with inverted rounded corners as an example.

In an exemplary embodiment, as shown in FIG. 1, the display region 100 may include: a first edge (also may be called a left edge) and a second edge (also may be called a right edge) which are oppositely disposed in the first direction X, and a third edge (also may be called an upper edge) and a fourth edge (also may be called a lower edge) which are oppositely disposed in the second direction Y, wherein adjacent edges are connected by an arced chamfer, forming a quadrilateral shape with inverted rounded corners. For example, the first edge and second edge may be parallel to the second direction Y, the third edge and the fourth edge may be parallel to the first direction X, the first direction X may be an extension direction of a scan signal line in the display region, the second direction Y may be an extension direction of a data signal line in the display region, and the first direction X and the second direction Y may be perpendicular to each other.

In an exemplary embodiment, the contour of the non-display region 200 may be a rectangular shape with inverted rounded corners. For example, as shown in FIG. 1, the non-display region 200 may include: a first bezel region (also may be called a lower bezel region) 201 and a second bezel region (also may be called an upper bezel region) 202 oppositely disposed in the second direction Y, and a third bezel region (also may be called a left bezel region) 203 and a fourth bezel region (also may be called a right bezel region) 204 oppositely disposed in the first direction X. The non-display region 200 may further include: a first corner region 211 connecting the first bezel region 201 and the third bezel region 203, a second corner region 212 connecting the first bezel region 201 and the fourth bezel region 204, a third corner region 213 connecting the second bezel region 202 and the third bezel region 203, and a fourth corner region 214 connecting the second bezel region 202 and the fourth bezel region 204.

In an internal circuit unit of a display apparatus (such as a mobile phone, etc.), a clock signal provided from one end (Pad end) of a display substrate connected with an external circuit to a GOA unit is transferred through a Bending region, and a clock signal trace from the lead line starting from the Bending region to the GOA unit is relatively long, which easily leads to the accumulation of electrostatic charges in the corner region. Therefore, in order to prevent electrostatic discharge (ESD) damage, an ESD protection unit is generally provided in the arc-shaped corner region. However, due to unreasonable use of space in some technologies, wiring space of the first power supply line VSS is encroached, so that a current density in a local region of the first power supply line VSS is relatively high, and the risk of burning the first power line VSS is prone to occur, and the uniformity and yield of display products are reduced.

Figures 2, 3:
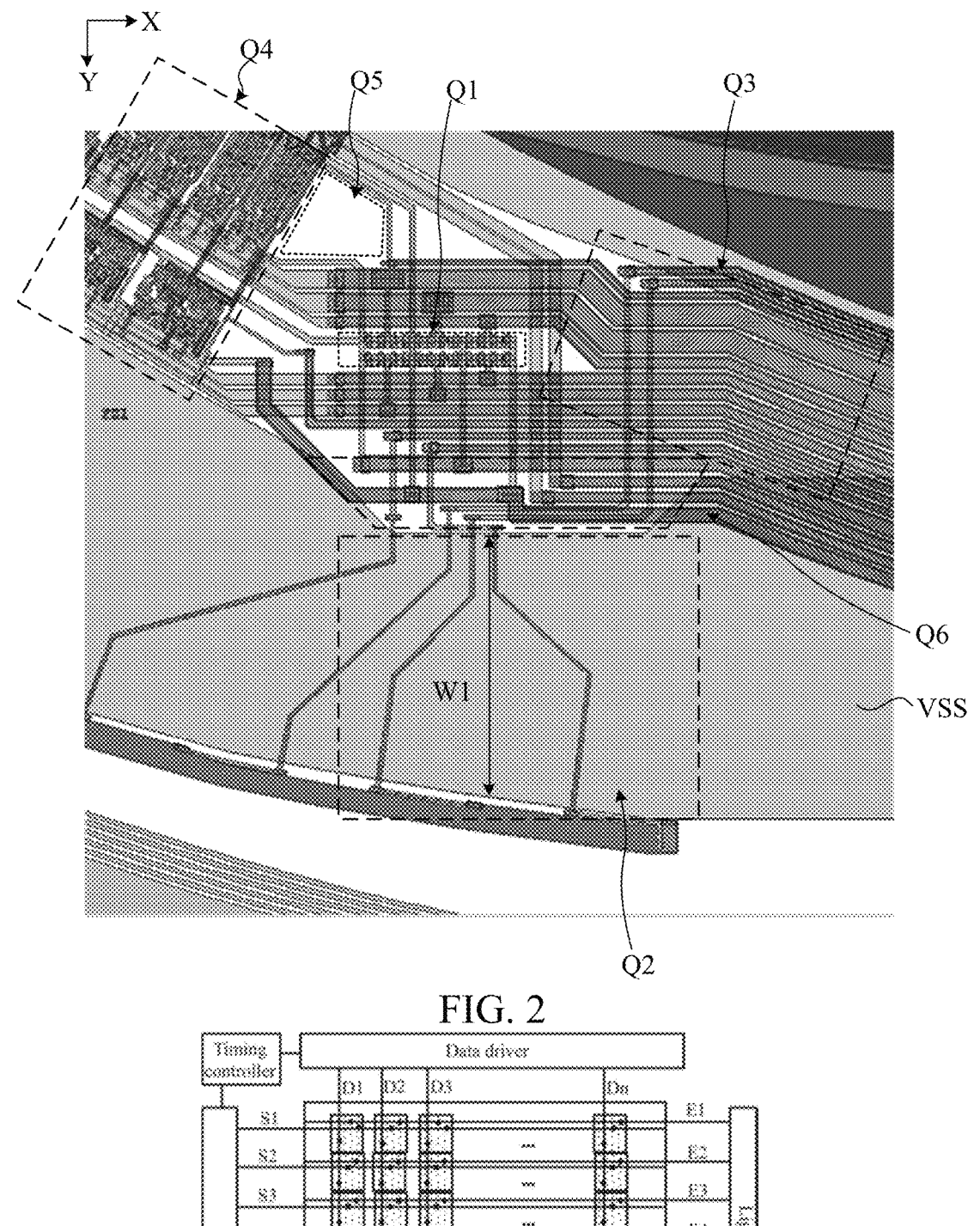
FIG. 2 is a partial schematic diagram of a first corner region in the display apparatus shown in FIG. 1 in some technologies.
FIG. 3 is a schematic diagram of a structure of a display apparatus.

FIG. 2 is a partial schematic diagram of the corner region in the display apparatus shown in FIG. 1 in some technologies, and FIG. 2 is schematically illustrated by taking the first corner region of FIG. 1 as an example. As shown in FIG. 2, an ESD protection unit is illustrated in an Region Q1, a partial trace of the clock signal line is illustrated in an region Q3, the GOA unit of the last stage is illustrated in an region Q4. Due to unreasonable layout of the ESD protection unit, after the clock signal line in the region Q3 is transferred to the GOA unit of the last stage in the region Q4 through the ESD protection unit in the region Q1, a part of the wiring space (i.e., the blank region Q5) is wasted, so that the wiring of the clock signal line of the GOA unit occupies a large space, resulting in that it is necessary to reserve an region Q6 to avoid the GOA jumper, encroaching on the wiring space of the first power supply line VSS, narrowing the local region Q2 of the first power supply line VSS, resulting in a large current density flowing through the local region Q2, and a risk of burning.

FIG. 3 is a schematic diagram of a structure of a display apparatus. As shown in FIG. 3, the display apparatus may include a timing controller, a data driver, a scan driver, a light-emitting driver and a pixel array. The timing controller is connected to the data driver, the scan driver and the light-emitting driver, respectively, the data driver is connected to multiple data signal lines (D1 to Dn) respectively, the scan driver is connected to multiple scan signal lines (S1 to Sm) respectively, and the light emitting driver is connected to multiple light-emitting signal lines (E1 to Eo) respectively. The pixel array may include multiple sub-pixels Pxij, wherein i and j may be natural numbers. At least one sub-pixel Pxij may include a circuit unit and a light-emitting device connected to the circuit unit, wherein the circuit unit may include a pixel drive circuit, the pixel drive circuit may be connected with a scan signal line, a light-emitting signal line and a data signal line respectively. In an exemplary embodiment, the timing controller may provide a gray-scale value and a control signal, which are suitable for a specification of the data driver, to the data driver; provide a clock signal, a scan starting signal, and the like, which are suitable for a specification of the scan driver, to the scan driver; and provide a clock signal, a light-emitting stop signal, and the like, which are suitable for a specification of the light emitting driver, to the light emitting driver. The data driver may generate a data voltage to be provided to the data signal lines D1, D2, D3, . . . , and Dn by using the gray-scale value and the control signal that are received from the timing controller. For example, the data driver may sample the gray-scale value by using the clock signal, and apply a data voltage corresponding to the gray-scale value to the data signal lines D1 to Dn by taking a pixel row as a unit, wherein n may be a natural number. The scan driver may receive the clock signal, the scan starting signal, etc., from the timing controller to generate a scan signal to be provided to the scan signal lines S1, S2, S3, . . . , and Sm. For example, the scan driver may provide a scan signal with an on-level pulse to the scan signal lines S1 to Sm sequentially. For example, a scan driver may be implemented using a Gate GOA unit. For example, the scan driver may be constructed in a form of a shift register, and may generate a scan signal in a manner in which the scan starting signal provided in a form of an on-level pulse is transmitted to a next-stage circuit sequentially under the control of the clock signal, wherein m may be a natural number. The light-emitting driver may receive a clock signal, a transmit stop signal, etc., from the timing controller to generate a transmit signal to be provided to the light-emitting signal lines E1, E2, E3, . . . , and Eo. For example, the light-emitting driver may provide a transmit signal with an off-level pulse to the light-emitting signal lines E1 to Eo sequentially. For example, the light-emitting driver may be implemented using an EM GOA unit. For example, the light-emitting driver may be constructed in a form of a shift register, and may generate a transmit signal in a manner in which the transmit stop signal provided in a form of an off-level pulse is transmitted to a next-stage circuit sequentially under the control of the clock signal, wherein o may be a natural number.

Figure 4:
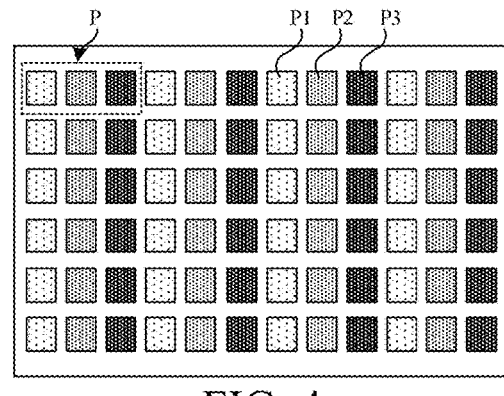
FIG. 4 is a schematic diagram of a planar structure of a display region of a display substrate.

FIG. 4 is a schematic diagram of a planar structure of a display region of a display substrate. As shown in FIG. 4, the display region may include multiple pixel units P arranged in a matrix, at least one pixel unit of the multiple pixel unit may include a first sub-pixel P1 emitting light of a first color, a second sub-pixel P2 emitting light of a second color, and a third sub-pixel P3 emitting light of a third color. The first sub-pixel P1, the second sub-pixel P2, and the third sub-pixel P3 may each include a pixel drive circuit and a light-emitting device. Pixel drive circuits in the first sub-pixel P1, the second sub-pixel P2, and the third sub-pixel P3 are connected with a scan signal line, a data signal line, and a light-emitting signal line respectively. The pixel drive circuit is configured to receive a data voltage transmitted by a data signal line under control of a scan signal line and a light-emitting signal line, and output a corresponding current to the light-emitting device. A light-emitting device in each of the first sub-pixel P1, the second sub-pixel P2, and the third sub-pixel P3 is connected with a pixel drive circuit of a sub-pixel where the light-emitting device is located, and is configured to emit light with corresponding brightness in response to a current output by the pixel drive circuit of the sub-pixel where the light-emitting device is located.

In an exemplary embodiment, a pixel unit P may include a red sub-pixel, a green sub-pixel, and a blue sub-pixel, or the pixel unit P may include a red sub-pixel, a green sub-pixel, a blue sub-pixel, and a white sub-pixel. Here, no limitation is made thereto in embodiments of the present disclosure.

In an exemplary embodiment, the sub-pixels in the pixel unit may be rectangular, rhombic, pentagonal, hexagonal, or the like in shape. For example, when a pixel unit includes three sub-pixels, the three sub-pixels may be arranged in a manner, such as standing side by side horizontally, standing side by side vertically, a shape like a Chinese character " 品 ", or the like. For example, when a pixel unit includes four sub-pixels, the four sub-pixels may be arranged in a manner, such as standing side by side horizontally, standing side by side vertically, a square shape, or the like, and here, no limitation is made thereto in embodiments of the present disclosure.

Figure 5:
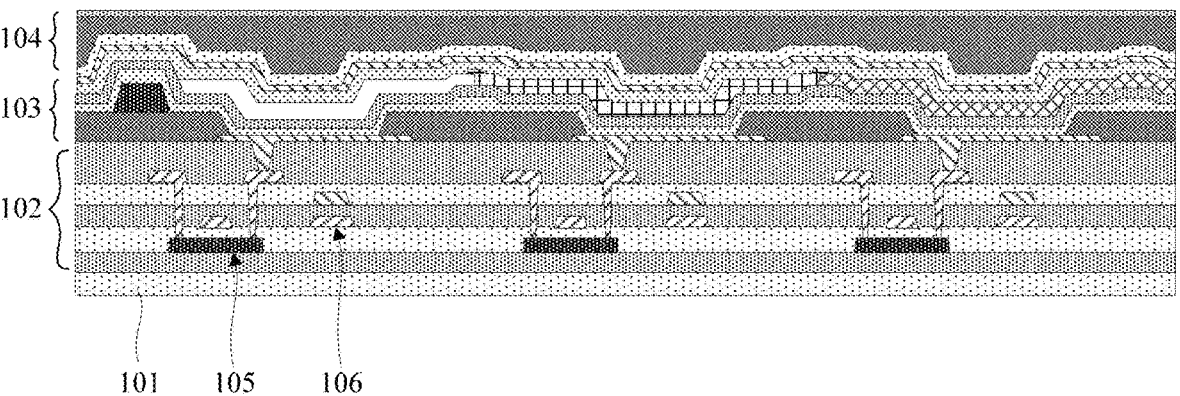
FIG. 5 is a schematic diagram of a cross-sectional view of a structure of a display region of a display substrate.

FIG. 5 is a schematic diagram of a cross-sectional view of a structure of a display region of a display substrate, and FIG. 5 is schematically illustrated by taking a structure of three sub-pixels in an OLED display substrate as an example. As shown in FIG. 5, in a plane perpendicular to the display substrate, the display substrate may include a base substrate 101, a drive circuit layer 102 disposed on the base substrate 101, a light-emitting structure layer 103 disposed at a side of the drive circuit layer 102 away from the base substrate 101, and an encapsulation structure layer 104 disposed at a side of the light-emitting structure layer 103 away from the base substrate 101. In some possible implementations, the display substrate may include other film layers, such as a touch structure layer, and here, no limitation is made thereto in embodiments of the present disclosure.

In an exemplary embodiment, the base substrate may be a flexible base substrate, or may be a rigid base substrate. For example, the rigid base substrate may include, but is not limited to, one or more of glass and quartz. For example, the flexible substrate may include, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fiber. For example, the flexible base substrate may include a first flexible material layer, a first inorganic material layer, a semiconductor layer, a second flexible material layer, and a second inorganic material layer that are stacked. The first flexible material layer and the second flexible material layer may be made of a material, such as Polyimide (PI), Polyethylene Terephthalate (PET), or a soft polymer film subjected to a surface treatment. The first inorganic material layer and the second inorganic material layer may be made of silicon nitride (SiNx), silicon oxide (SiOx), or the like, so as to improve a water and oxygen resistance capability of the base substrate.

In an exemplary embodiment, a drive circuit layer 102 of each sub-pixel may include multiple transistors and a storage capacitor which form a pixel drive circuit. Illustration is made by taking each sub-pixel including a drive transistor and a storage capacitor as an example in FIG. 5. For example, the drive circuit layer 102 of each sub-pixel may include: a first insulation layer disposed on the base substrate; an active layer disposed on the first insulation layer; a second insulation layer covering the active layer; a gate electrode and a first capacitance electrode disposed on the second insulation layer; a third insulation layer covering the gate electrode and the first capacitance electrode; a second capacitance electrode disposed on the third insulation layer; a fourth insulation layer covering the second capacitance electrode, vias being provided on the second insulation layer, the third insulation layer, and the fourth insulation layer and exposing the active layer; a source electrode and a drain electrode disposed on the fourth insulation layer, the source electrode and the drain electrode being respectively connected with the active layer through vias; and a planarization layer covering an aforementioned structure, vias being provided on the planarization layer and exposing the drain electrode. The active layer, the gate electrode, the source electrode, and the drain electrode form the drive transistor 105, and the first capacitance electrode and the second capacitance electrode form the storage capacitor 106.

In an exemplary embodiment, the light-emitting device 103 may include an anode, a pixel definition layer, an organic light-emitting layer, and a cathode. The anode is disposed on the planarization layer, and is connected with the drain electrode of the drive transistor through vias provided on the planarization layer; the pixel definition layer is disposed on the anode and the planarization layer, and a pixel opening is provided on the pixel definition layer and exposes the anode; the organic light-emitting layer is at least partially disposed in the pixel opening, and is connected with the anode; the cathode is disposed on the organic light-emitting layer, and is connected with the organic light-emitting layer; and the organic light-emitting layer emits light of a corresponding color under drive of the anode and the cathode.

In an exemplary embodiment, the encapsulation layer 104 may include a first encapsulation layer, a second encapsulation layer and a third encapsulation layer that are stacked; the first encapsulation layer and the third encapsulation layer may be made of an inorganic material, and the second encapsulation layer may be made of an organic material; the second encapsulation layer is disposed between the first encapsulation layer and the third encapsulation layer, which can ensure that external moisture cannot enter into the light-emitting device 103.

In an exemplary embodiment, the organic light-emitting layer may at least include a hole injection layer, a hole transport layer, a light-emitting layer and a hole block layer which are stacked on the anode. In an exemplary embodiment, hole injection layers of all sub-pixels are connected together to form a common layer, hole transport layers of all sub-pixels are connected together to form a common layer, light-emitting layers of adjacent sub-pixels may be slightly overlapped with each other, or may be separate from each other, and hole block layers are connected together to form a common layer.

In an exemplary embodiment, the pixel drive circuit may be of a 3T1C, 4T1C, 5T1C, 5T2C, 6T1C, or 7T1C structure, or the like. For example, the pixel drive circuit may include seven switch transistors (first transistor T1 to seventh transistor T7), a storage capacitor C and eight signal lines (a data signal line DATA, a first scan signal line S1, a second scan signal line S2, a first initial signal line INIT1, a second initial signal line INIT2, a first power supply line VSS, a second power supply line VDD, and a light-emitting signal line EM).

In an exemplary embodiment, a control electrode of the first transistor T1 is connected with the second scan signal line S2, a first electrode of the first transistor T1 is connected with the first initial signal line INIT1, and a second electrode of the first transistor is connected with a second node N2. A control electrode of the second transistor T2 is connected with the first scan signal line S1, the first electrode of the second transistor T2 is connected with the second node N2, and the second electrode of the second transistor T2 is connected with the third node N3. A control electrode of the third transistor T3 is connected with the second node N2, a first electrode of the third transistor T3 is connected with a first node N1, and a second electrode of the third transistor T3 is connected with the third node N3. A control electrode of the fourth transistor T4 is connected with the first scan signal line S1, a first electrode of the fourth transistor T4 is connected with the data signal line DATA, and a second electrode of the fourth transistor T4 is connected with the first node N1. A control electrode of the fifth transistor T5 is connected with the light-emitting signal line EM, a first electrode of the fifth transistor T5 is connected with the second power supply line VDD, and a second electrode of the fifth transistor T5 is connected with the first node N1. A control electrode of the sixth transistor T6 is connected with the light-emitting signal line EM, a first electrode of the sixth transistor T6 is connected with the third node N3, and a second electrode of the sixth transistor T6 is connected with a first electrode of a light-emitting device. A control electrode of the seventh transistor T7 is connected with the first scan signal line S1, a first electrode of the seventh transistor T7 is connected with the second initial signal line INIT2, and a second electrode of the seventh transistor T7 is connected with the first electrode of the light-emitting device. A first end of the storage capacitor C is connected with the second power supply line VDD, and a second end of the storage capacitor C is connected with the second node N2.

In an exemplary embodiment, the first transistor T1 to the seventh transistor T7 may be P-type transistors or N-type transistors. Use of a same type of transistors in a pixel drive circuit may simplify a process flow, reduce process difficulties of a display panel, and improve a product yield. In some possible implementations, the first transistor T1 to the seventh transistor T7 may include P-type transistors and N-type transistors.

In an exemplary embodiment, a second electrode of the light-emitting device is connected to the first power supply line VSS. A signal of the first power supply line VSS is a low-level signal. A signal of the second power supply line VDD is a high-level signal continuously provided. The first scan signal line S1 is a scan signal line in pixel drive circuits of a current display row, and the second scan signal line S2 is a scan signal line in pixel drive circuits of a previous display row. That is, for an n-th display row, the first scan signal line S1 is S(n), and the second scan signal line S2 is S(n−1). The second scan signal line S2 of the current display row and the first scan signal line S1 in the pixel drive circuits of the previous display row are a same signal line, thus signal lines of the display panel may be reduced, so that a narrow bezel of the display panel is achieved.

An exemplary embodiment of the present disclosure provides a display substrate. The display substrate may include a display region and a non-display region located at the periphery of the display region. The non-display region may include a composite circuit region, and a first trace region located on a side of the composite circuit region away from the display region. The composite circuit region may include an electrostatic discharge protection circuit, the electrostatic discharge protection circuit may include multiple electrostatic discharge protection units, at least one electrostatic discharge protection unit of the multiple electrostatic discharge protection units extends along a first inclined direction, there is a first preset included angle between the first inclined direction DR1 and the first direction X, the first preset included angle may be greater than 0° and less than 90°, and the first direction X is an extension direction of a scan signal line in the display region. The first trace region may include a power supply line and at least one auxiliary electrode. An orthographic projection of the at least one auxiliary electrode on the display substrate plane is overlapped with an orthographic projection of the power supply line on the display substrate plane, and the at least one auxiliary electrode is connected with the power supply line. Thereby, on one hand, the ESD protection circuit is divide into multiple ESD protection units, and the ESD protection unit is flexibly and obliquely disposed, the space occupied by an ESD unit can be reduced, which is beneficial to make full use of the layout space in the bezel region reasonably, thereby ensuring a narrow bezel, avoiding the reduction of an area of the power supply line and the increase of power supply line loading, and further reducing the burn risk caused by excessive local current of power supply line, which is beneficial to improve display uniformity. On the other hand, by adding auxiliary electrodes and connecting them with the power supply line, the loading of the power supply line can be reduced, thus effectively alleviating the voltage drop (IR Drop), which is beneficial to improve display uniformity and product yield. Therefore, display uniformity and product yield can be improved.

Here, the power supply line connected with the auxiliary electrode may refer to a first power supply line VSS, and the first power supply line VSS is configured to provide a low voltage signal to the display substrate. For example, a part of a trace of the first power supply line VSS located in the arc-shaped corner region includes: a first sub-trace part extending along the first inclined direction DR1 and a second sub-trace part extending along the first direction X.

Herein, the degree of the first preset included angle is related to the structural parameters such as the shape and size of the outer contour of the region where the ESD protection circuit is located. For example, it may be disposed according to a radian of an inverted rounded corner of the outer contour of the display region or an included angle between a tangent line of the outer contour and the first direction, so long as wiring space can be reasonably utilized and encroaching wiring space of other traces can be avoided. In an exemplary embodiment, the first preset included angle may include, but is not limited to, about 5° to 85°, 10° to 80°, 15° to 75°, 20° to 70°, 25° to 65°, or 30° to 65°, etc. Here, no limitation is made thereto in embodiments of the present disclosure.

In an exemplary embodiment, at least one auxiliary electrode is connected with the power supply line, including: at least one auxiliary electrode is connected with the power supply line through a via, or at least one auxiliary electrode is directly lapped with the power supply line. Here, no limitation is made thereto in embodiments of the present disclosure.

In an exemplary embodiment, the non-display region may include: a first voltage signal line, a second voltage signal line, and an electrostatic discharge protection line. Each electrostatic discharge protection unit may include: at least two transistors connected in series, a first electrode of each transistor is connected with a gate electrode, the first voltage signal line is connected with one transistor located at one end of the electrostatic discharge protection unit, the second voltage signal line is connected with another transistor located at the other end of the electrostatic discharge protection unit, the electrostatic discharge protection line is connected with any one connection node located between the one transistor and the another transistor, and the electrostatic discharge protection unit is configured to discharge electrostatic charges accumulated on the electrostatic discharge protection line. In this way, the ESD protection unit is implemented by employing a transistor structure, so that when other transistors in the display substrate are manufactured, the ESD protection unit may be manufactured at the same time without adding an additional manufacturing process.

Here, the connection node may refer to a node formed between two adjacent transistors connected in series. For example, taking the ESD protection unit including four transistors connected in series as an example, the one transistor located at one end of the ESD protection unit may refer to a fourth transistor, the another transistor located at the other end of the ESD protection unit may refer to a first transistor, and any one connection node located between the one transistor and the another transistor may include: a first connection node formed by the first transistor connected in series with a second transistor, a second connection node formed by a second transistor connected in series with a third transistor, or a third connection node formed by a third transistor connected in series with the fourth transistor. For example, the electrostatic discharge protection line Signal may be connected with the second connection node formed by the second transistor connected in series with the third transistor.

Here, the electrostatic discharge protection line Signal refers to a trace on the display substrate that is easy to accumulate electrostatic charges, and the ESD protection unit is configured to release the electrostatic charges accumulated on the electrostatic discharge protection line Signal. For example, the electrostatic charges may be positive or negative.

In an exemplary embodiment, taking the ESD protection unit being connected with a GOA unit as an example, the electrostatic discharge protection line Signal may include, but is not limited to: at least a part of signal lines, such as a first clock signal line ESTV, a second clock signal line ECB, a third clock signal line ECK, a fourth clock signal line GSTV, a fifth clock signal line GCB, a sixth clock signal line GCK, a seventh clock signal line RSTV, an eighth clock signal line RCB, or a ninth clock signal line RCK, etc. Of course, the electrostatic discharge protection line Signal may also be another signal line on which electrostatic discharge protection is needed, and here, no limitation is made thereto in embodiments of the present disclosure.

In an exemplary embodiment, each electrostatic discharge protection line Signal may be connected to at least one ESD protection unit to achieve the electrostatic discharge protection.

In an exemplary embodiment, a signal of the first voltage signal line VGH is a high level signal, and a signal of the second voltage signal line VGL is a low level signal.

In an exemplary embodiment, for each ESD protection unit, multiple transistors connected in series may include, but are not limited to: two transistors connected in series, three transistors connected in series, four transistors connected in series, five transistors connected in series, or six transistors connected in series, or another structure. Herein, the number of transistors in the ESD protection unit may be set according to an actual application scenario, and here, no limitation is made thereto in embodiments of the present disclosure.

In an exemplary embodiment, the non-display region may further include: a second trace region located on a side of the first trace region away from the display region, the non-display region may further include: multiple crack detection lines, the multiple crack detection lines are configured to detect cracks, and a crack detection line may include: a detection connection line located in a composite circuit region, a detection lead line located in the first trace region, and a detection extension line located in the second trace region, which are sequentially connected.

In an exemplary embodiment, the auxiliary electrode may include: multiple sub-auxiliary electrodes, the multiple sub-auxiliary electrodes are sequentially and continuously disposed along an extension direction of the power supply line, and the sub-auxiliary electrodes are all disposed on a side of the detection lead line.

In an exemplary embodiment, the auxiliary electrode may include: multiple sub-auxiliary electrodes, the multiple sub-auxiliary electrodes are sequentially disposed at intervals along the extension direction of the power supply line, the multiple sub-auxiliary electrodes include: at least one of a first sub-auxiliary electrode, a second sub-auxiliary electrode and a third sub-auxiliary electrode, wherein the first sub-auxiliary electrode is disposed on a side of the detection lead line in an opposite direction of the first direction, the second sub-auxiliary electrode is disposed between the detection lead lines, and the third sub-auxiliary electrode is disposed on a side of the detection lead line in the first direction.

In an exemplary embodiment, the power supply line is located in the first trace region, an extension direction of a detection lead line intersects with an extension direction of the power supply line, and a film layer on which the auxiliary electrode is located, a film layer on which the detection lead line is located, and a film layer on which the power supply line is located, are located at different film layers.

In an exemplary embodiment, the auxiliary electrode may include: at least one of the first-type auxiliary electrode and the second-type auxiliary electrode, and in a direction perpendicular to a plane of the display substrate, the film layer on which the first-type auxiliary electrode is located is between the film layer on which the detection lead line is located and the film layer on which the power supply line is located, and the film layer on which the second-type auxiliary electrode is located is located on a side of the power supply line away from the film layer on which the detection lead line is located.

In an exemplary embodiment, an orthographic projection of the detection lead line on the plane of the display substrate are not overlapped with an orthographic projection of the first-type auxiliary electrode on the plane of the display substrate, and the orthographic projection of the detection lead line on the plane of the display substrate are overlapped with an orthographic projection of the second-type auxiliary electrode on the plane of the display substrate.

In an exemplary embodiment, in a direction perpendicular to the plane of the display substrate, the display substrate may include a semiconductor layer, a first conductive layer, a second conductive layer and a third conductive layer that are sequentially disposed on the base substrate. The semiconductor layer may include active layers of at least two transistors, the first conductive layer may include gate electrodes of at least two transistors and the detection lead line, the second conductive layer may include the first-type auxiliary electrode, and the third conductive layer may include first electrodes of at least two transistors, second electrodes of at least two transistors, and the power supply line.

In an exemplary embodiment, the display substrate further includes a fourth conductive layer disposed on a side of the third conductive layer away from the base substrate, and the fourth conductive layer includes the second-type auxiliary electrode.

In an exemplary embodiment, the non-display region may include: a first bezel region and a second bezel region oppositely disposed in the second direction, a third bezel region and a fourth bezel region oppositely disposed in the first direction, a first corner region connecting the first bezel region and the third bezel region, a second corner region connecting the first bezel region and the fourth bezel region, a third corner region connecting the second bezel region and the third bezel region, and a fourth corner region connecting the second bezel region and the fourth bezel region, wherein at least one of the first corner region to the fourth corner region is an arc-shaped corner region, the electrostatic discharge protection unit and the auxiliary electrode are located in the arc-shaped corner region, and the second direction is an extension direction of a data signal line in the display region.

In an exemplary embodiment, at least one electrostatic discharge protection unit extends along the first inclined direction DR1, which may include at least two transistors in the at least one electrostatic discharge protection unit are sequentially disposed along the first inclined direction DR1. For example, at least two transistors are sequentially disposed along the first inclined direction DR1, which may refer to that: the at least two transistors are sequentially disposed along the first inclined direction DR1 and flush disposed in a second inclined direction DR2, wherein the second inclined direction DR2 may be perpendicular to the first inclined direction DR1. For example, the at least two transistors are sequentially disposed along the first inclined direction DR1, which may refer to that: active layers of the at least two transistors are sequentially disposed along the first inclined direction DR1, gate electrodes of the at least two transistors are sequentially disposed along the first inclined direction DR1, first electrodes of the at least two transistors are sequentially disposed along the first inclined direction DR1, and second electrodes of the at least two transistors are sequentially disposed along the first inclined direction DR1. For example, at least one electrostatic discharge protection unit extends along the first inclined direction DR1, which may include: an active layer of each transistor in at least one electrostatic discharge protection unit may extend along the first inclined direction DR1, and a first electrode, a second electrode, and a gate electrode of each transistor all extend along a second inclined direction DR2, wherein the second inclined direction DR2 is perpendicular to the first inclined direction DR1.

In an exemplary embodiment, in each ESD protection unit, active layers of multiple transistors may be of an integrated structure connected to each other.

In an exemplary embodiment, active layers of multiple transistors in multiple ESD protection units may be of an integrated structure connected to each other. For example, active layers of transistors in two ESD protection units or three ESD protection units disposed sequentially along the first inclined direction DR1 may be of an integrated structure connected to each other.

In an exemplary embodiment, multiple electrostatic discharge protection units are sequentially disposed along a second inclined direction DR2, or the multiple electrostatic discharge protection units are arranged in an array along a first inclined direction DR1 and a second inclined direction DR2, and the second inclined direction DR2 intersects with the first inclined direction DR1.

In an exemplary embodiment, at least one electrostatic discharge protection line Signal includes a gap trace part SL disposed between two adjacent ESD protection units. In this way, the ESD protection circuit is divided into multiple ESD protection units, the ESD protection units are flexibly inclined, and the ESD protection line Signal is disposed to trace from the gap between two adjacent ESD protection units, so that the trace layout optimization can be realized and the layout space can be more reasonably utilized.

In an exemplary embodiment, an extension direction of the gap trace part is parallel to an inclined direction of at least one of two adjacent electrostatic discharge protection units. For example, taking a case in which multiple ESD protection units in an ESD protection circuit are sequentially disposed along the second inclined direction DR2, and each ESD protection unit is disposed along the first inclined direction DR1 as an example, the gap trace part SL of an electrostatic discharge protection line Signal connected with the ESD protection circuit may be disposed along the first inclined direction DR1.

In an exemplary embodiment, at least one of the electrostatic discharge protection line Signal, the first voltage signal line VGH, and the second voltage signal line VGL includes:

a first trace and a second trace, wherein the first trace is disposed on a same layer as first electrodes and second electrodes of the transistors in the electrostatic discharge protection unit, and the second trace is disposed on a same layer as gate electrodes of the transistors in the electrostatic discharge protection unit.

In an exemplary embodiment, at least one of the electrostatic discharge protection line, the first voltage signal line, and the second voltage signal line further includes: a third trace, wherein a film layer on which the third trace is located is located between a film layer on which the first trace is located and a film layer on which the second trace is located.

In an exemplary embodiment, the non-display region may further include: a GOA circuit, the GOA circuit may include multiple GOA unit, the multiple GOA unit is connected with a scan signal line in the display region, and at least one of the multiple GOA units is connected to an electrostatic discharge protection line. Thus, by disposing the ESD protection unit obliquely along the first inclined direction DR1, wiring space occupied by the ESD protection unit can be reduced, and wiring space occupied by the electrostatic discharge protection line between the GOA unit and the ESD protection unit can be saved. Therefore, uniformity and yield of the product can be effectively improved. In addition, since the GOA unit is connected with an electrostatic discharge protection line in a corresponding ESD protection unit, while the ESD protection unit is configured to release electrostatic charges accumulated on the electrostatic discharge protection line Signal, the ESD protection unit can protect the GOA unit from ESD damage.

In an exemplary embodiment, the non-display region of the display substrate may include, but is not limited to: a GOA circuit, an ESD circuit, and a trace (e.g., a first power supply line VSS, a clock signal line, etc.). Of course, the non-display region may also include: other circuit(s), such as a source drive circuit for providing a data voltage to a data signal line, or a detection circuit (CT) for performance detection, etc., and here, no limitation is made thereto in embodiments of the present disclosure.

In an exemplary embodiment, the display substrate may be an array substrate.

In an exemplary embodiment, the display substrate may be an Organic Light Emitting Diode (OLED) display substrate, or a Liquid Crystal Display (LCD) display substrate, etc. Here, no limitation is made thereto in embodiments of the present disclosure.

The display substrate in an exemplary embodiment of the present disclosure will be described below with reference to the accompanying drawings by taking a case in which both the contour of the display region and the contour of the non-display region in the display substrate are a rectangular shape with inverted rounded corners as an example.

Figure 6:
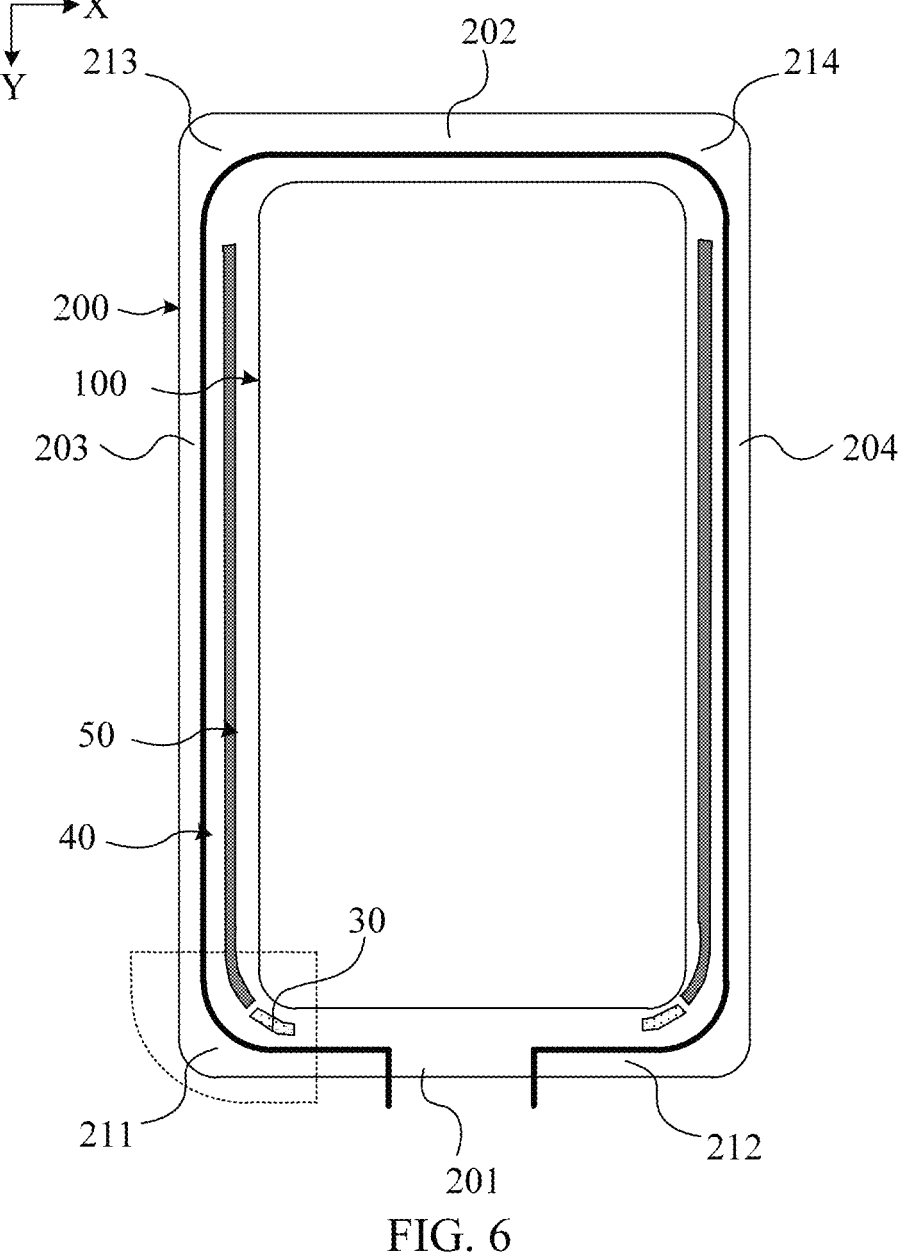
FIG. 6 is a schematic diagram of a first structure of a display substrate in an exemplary embodiment of the present disclosure.
Figure 7:
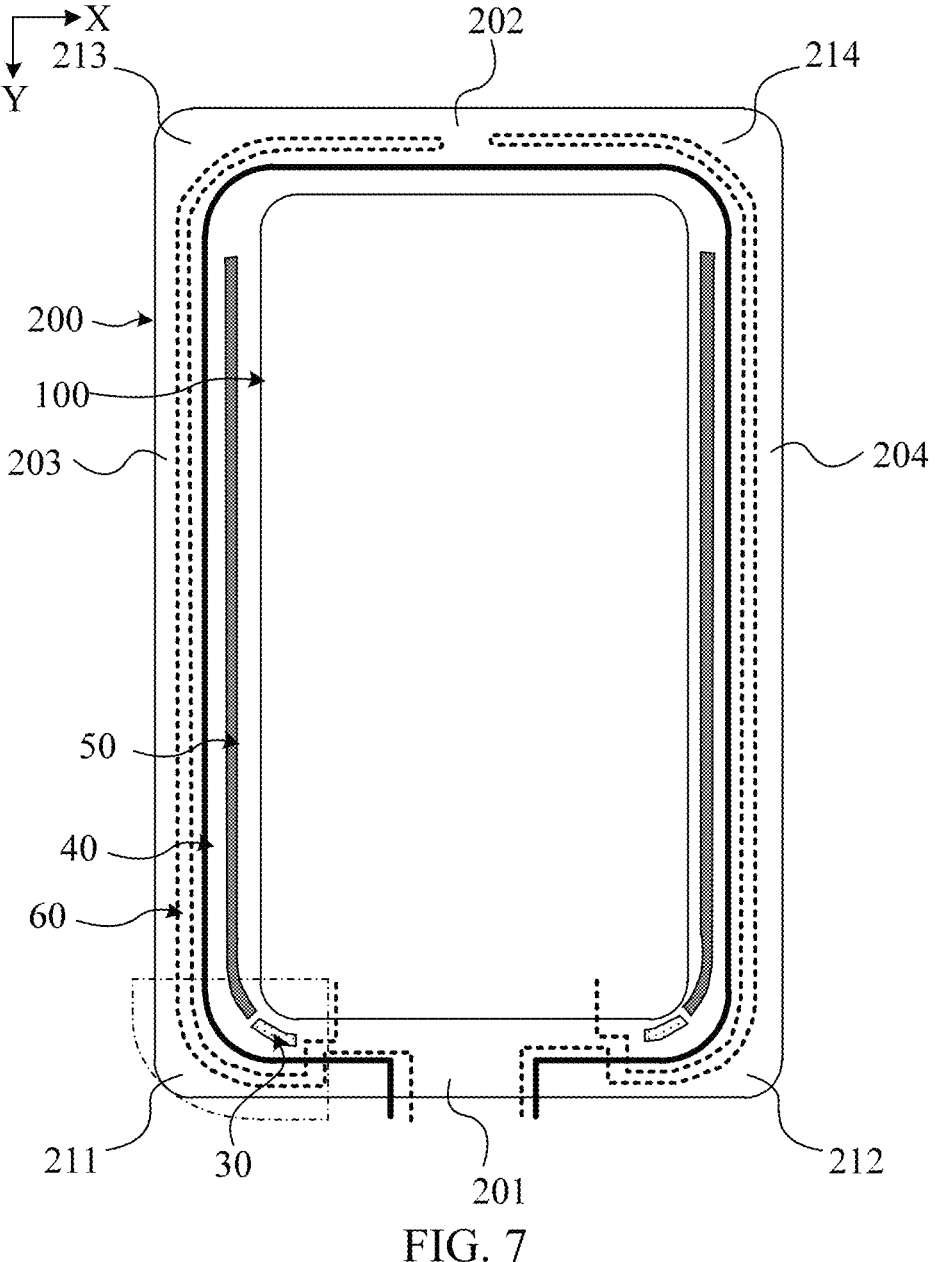
FIG. 7 is a schematic diagram of a second structure of a display substrate in an exemplary embodiment of the present disclosure.

FIG. 6 is a schematic diagram of a first structure of a display substrate in an exemplary embodiment of the present disclosure, and FIG. 7 is a schematic diagram of a second structure of a display substrate in an exemplary embodiment of the present disclosure. As shown in FIG. 6 and FIG. 7, the display substrate may include a display region 100 and a non-display region 200 located on a periphery of the display region 100. The non-display region 200 may include: a first bezel region 201 and a second bezel region 202 oppositely disposed in the second direction Y, and a third bezel region 203 and a fourth bezel region 204 oppositely disposed in the first direction X. The non-display region 200 may further include: a first corner region 211 connecting the first bezel region 201 and the third bezel region 203, a second corner region 212 connecting the first bezel region 201 and the fourth bezel region 204, a third corner region 213 connecting the second bezel region 202 and the third bezel region 203, and a fourth corner region 214 connecting the second bezel region 202 and the fourth bezel region 204, wherein the first direction X is an extension direction of the scan signal line in the display region 100, and the second direction Y is an extension direction of the data signal line in the display region 100. For example, the first corner region 211 to the fourth corner region 214 are corner regions with inverted rounded corners. For example, the first corner region 211 may include multiple ESD protection units 30, and the second corner region 212 may include multiple ESD protection units 30.

In an exemplary embodiment, as shown in FIG. 6 and FIG. 7, the non-display region 200 may further include multiple ESD protection units 30, multiple electrostatic discharge protection lines Signal, and multiple GOA units 50, wherein at least one ESD protection unit 30 is connected with at least one electrostatic discharge protection line Signal, and connected with at least one GOA unit 50. Thus, since the multiple GOA units 50 are arranged along an outer contour of the display region 100, by disposing the ESD protection units obliquely along the first inclined direction DR1, wiring space occupied by the ESD protection units can be reduced, and wiring space occupied by the electrostatic discharge protection line Signal can be saved. Therefore, uniformity and yield of a product can be effectively improved. Moreover, since the ESD protection unit 30 is configured to release electrostatic charges accumulated on the electrostatic discharge protection line Signal, the ESD protection unit 30 can protect the GOA unit 50 from ESD damage.

In an exemplary embodiment, as shown in FIG. 6 and FIG. 7, by taking the display substrate including multiple cascaded GOA units 50 as an example, multiple cascaded GOA units 50 may be arranged along the outer contour of the display region 100, and the extension direction of the electrostatic discharge protection line Signal connected with the last-stage GOA unit 50 is disposed the same or approximately the same as the first inclined direction DR1. Thus, by disposing the extension direction of the electrostatic discharge protection line Signal connected with the last-stage GOA unit 50 to be the same as the first inclined direction DR1, wiring space occupied by the GOA unit 50 in the first direction X and the second direction Y perpendicular to the first direction X can be reduced, so that wiring space of the GOA unit can be reduced, wiring space occupied by the connection line between the GOA unit and the ESD protection unit can be saved, encroaching wiring space of other traces can be avoided, and uniformity and yield of a product can be effectively improved.

For example, taking a case in which the electrostatic discharge protection line Signal to which the last-stage GOA unit 50 is connected is a broken line as an example, "the extension direction of the electrostatic discharge protection line Signal connected with the last-stage GOA unit is the same as the first inclined direction DR1" may mean that the extension direction of the main body part of the electrostatic discharge protection line Signal is the same as the first inclined direction DR1. Alternatively, taking a case in which the electrostatic discharge protection line Signal to which the last-stage GOA unit is connected is a curve as an example, "the extension direction of the electrostatic discharge protection line Signal connected with the last-stage GOA unit is the same as the first inclined direction DR1" may mean that a tangent direction of the electrostatic discharge protection line Signal is the same as the first inclined direction DR1. Here, no limitation is made thereto in embodiments of the present disclosure.

In an exemplary embodiment, the GOA Unit 50 may include one or more of a Gate GOA unit, an EM GOA unit, and a Reset GOA unit. Correspondingly, for example, taking a case in which the GOA unit 50 is an EM GOA unit as an example, the electrostatic discharge protection line Signal to which the last-stage GOA unit 50 is connected may include at least one of a first clock Signal line ESTV, a second clock Signal line ECB, and a third clock Signal line ECK. For example, taking a case in which the GOA unit 50 is a Gate GOA unit as an example, the electrostatic discharge protection line Signal to which the last-stage GOA unit 50 is connected may include at least one of a fourth clock Signal line GSTV, a fifth clock Signal line GCB, and a sixth clock Signal line GCK. For example, taking a case in which the GOA unit 50 is a Reset GOA unit as an example, the electrostatic discharge protection line Signal to which the last-stage GOA unit 50 is connected may include at least one of a seventh clock Signal line RSTV, an eighth clock Signal line RCB, and a ninth clock Signal line. Here, no limitation is made thereto in embodiments of the present disclosure.

In an exemplary embodiment, as shown in FIG. 7, the non-display region 200 may further include at least one crack detection line 60, the at least one crack detection line 60 is configured to detect cracks. For example, the at least one crack detection line 60 may be connected with sub-pixels in the display region 100 through a switching element, since when a crack appears in the non-display region 200, the crack detection line 60 will be broken, and the signal transmitted by the crack detection line 60 is affected, a detection signal is applied to the crack detection line 60 and a control signal is applied to the switching element when detection is performed, and whether the crack detection line 60 is broken is determined by observing whether a sub-pixel connected with the crack detection line 60 emits light, thereby determining whether a crack exists at an edge of the display substrate. For another example, the crack detection line may electrically connected with at least one data signal line in the display region 100, and at least one data signal line is electrically connected with multiple sub-pixels in the display region 100. Since when a crack appears in the non-display region 200, the crack detection line 60 will be broken, a signal transmitted by the crack detection line 60 is affected, thereby whether there is a crack appearing in the non-display region 200 is determined according to whether a sub-pixel electrically connected with the crack detection line 60 is lighted up, which can accurately detect whether the display substrate is damaged during cutting, help the quality inspection staff to screen out the display substrate with a poor display effect, and ensure a product yield.

Figure 8:
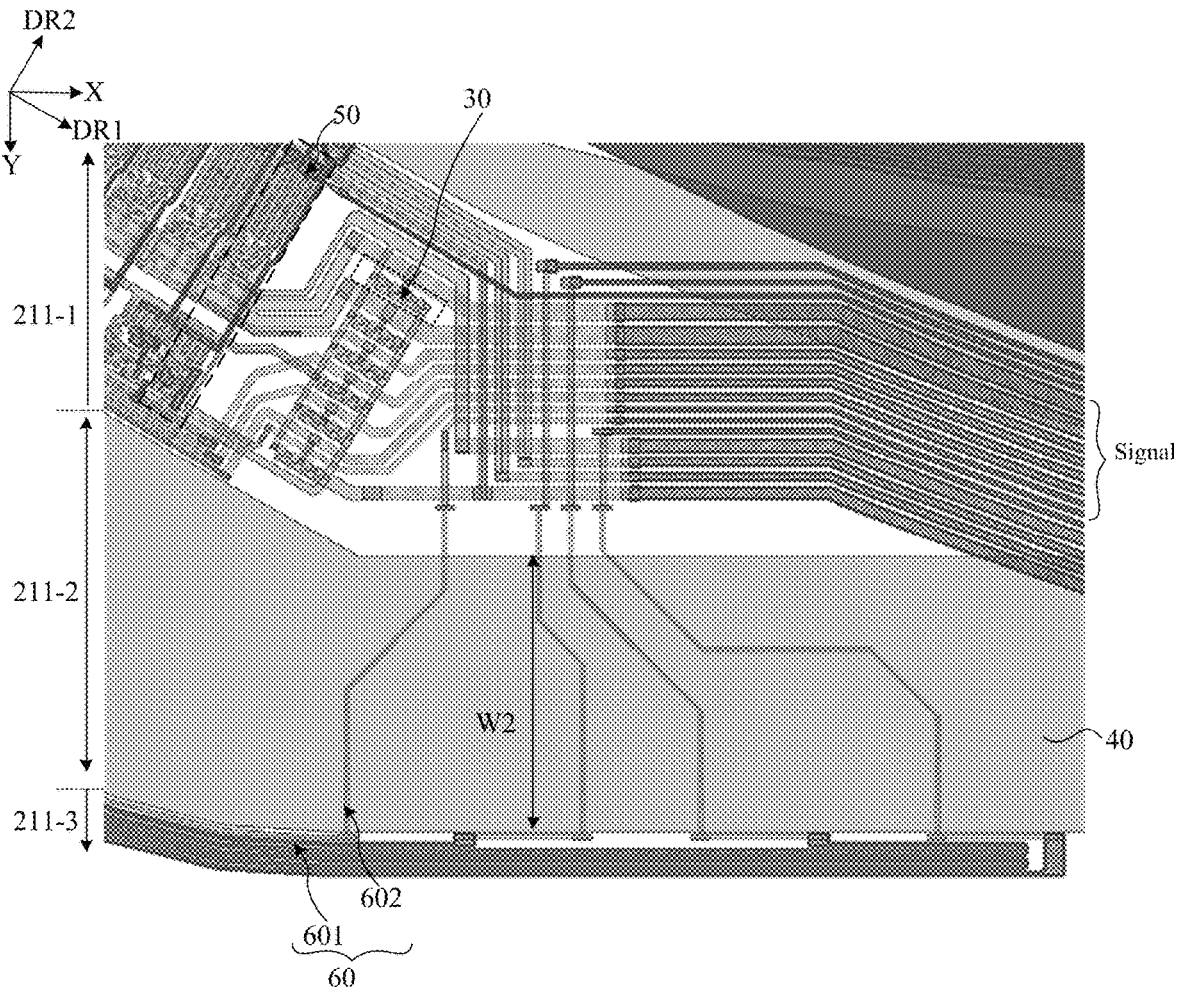
FIG. 8 is a schematic diagram of a structure of a corner region of a display substrate in an exemplary embodiment of the present disclosure.

FIG. 8 is a schematic diagram of a structure of a corner region of a display substrate in an exemplary embodiment of the present disclosure, and FIG. 8 is illustrated by taking the first corner region 211 in the display substrate shown in FIG. 7 as an example.

In an exemplary embodiment as shown in FIG. 8, at least one corner region of the non-display region 200 may include a composite circuit region 211-1, a first trace region 211-2 located on a side of the composite circuit region 211-1 away from the display region 100, and a second trace region 211-3 located on a side of the first trace region 211-2 away from the display region 100.

In an exemplary embodiment, as shown in FIG. 8, the composite circuit region 211-1 may include multiple GOA units 50, multiple ESD protection units 30, multiple electrostatic discharge protection lines Signal, and other trace(s)

(e.g., detection connection line 603, etc.). At least one electrostatic discharge protection line Signal is connected with at least one ESD protection unit 30 and at least one GOA unit 50. For example, the ESD protection unit may include: four transistors connected in series, wherein a second electrode of each transistor is connected with a gate electrode, the second voltage signal line VGL is connected with a first transistor at one end of the ESD protection unit, the first voltage signal line VGH is connected with a fourth transistor at another end of the ESD protection unit, and the electrostatic discharge protection line Signal is connected with a connection node formed between a second transistor and a third transistor. Thus, the ESD protection circuit is divided into multiple ESD protection units, and the ESD protection unit is flexibly and obliquely disposed, the space occupied by ESD unit can be reduced, which is beneficial to make full use of the layout space in the bezel region reasonably, thereby ensuring a narrow bezel, avoiding the reduction of an area of the power supply line and the increase of loading of the power supply line, and further reducing the burn risk caused by an excessive local current of the power supply line, and being beneficial to improve display uniformity.

In an exemplary embodiment, as shown in FIG. 8, the first trace region 211-2 may include a power supply line 40, and an auxiliary electrode (not shown in figures). An orthographic projection of the auxiliary electrode on the plane of the display substrate is overlapped with an orthographic projection of the power supply line on the plane of the display substrate, and the auxiliary electrode is connected with the power supply line through a via. For example, the power supply line 40 may be a first power supply line VSS. In this way, by adding the auxiliary electrode and disposing the auxiliary electrode to be connected with the power supply line, the loading of the power supply line can be reduced, thereby effectively alleviating the voltage drop (IR Drop), and being beneficial to improve the display uniformity and the product yield.

In an exemplary embodiment, as shown in FIG. 8, the first trace region 211-2 may further include a detection lead line 602, and an orthographic projection of the detection lead line 602 on the plane of the display substrate is overlapped with the orthographic projection of the power supply line on the plane of the display substrate.

In an exemplary embodiment, as shown in FIG. 8, the second trace region 211-3 may include a detection extension line 601, and the detection extension line 601 at least partially surrounds the display region 100.

In an exemplary embodiment, the detection extension line 601, the detection lead line 602, and the detection connection line 603 may form a crack detection line, and the crack detection line is configured to detect a crack.

Figure 9:
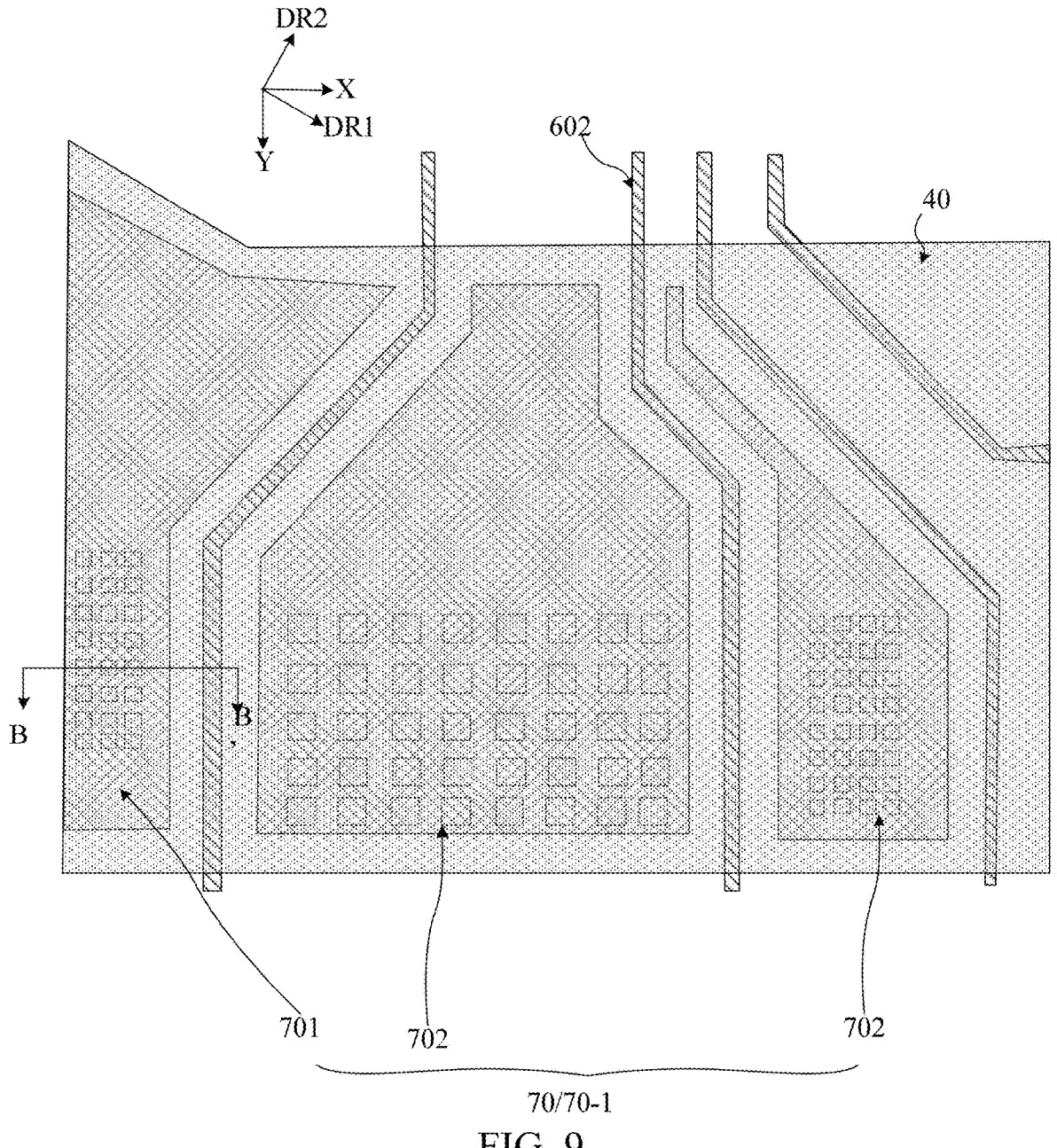
FIG. 9 is a schematic diagram of a first structure of a first trace region in a corner region of a display substrate in an exemplary embodiment of the present disclosure.
Figure 10:
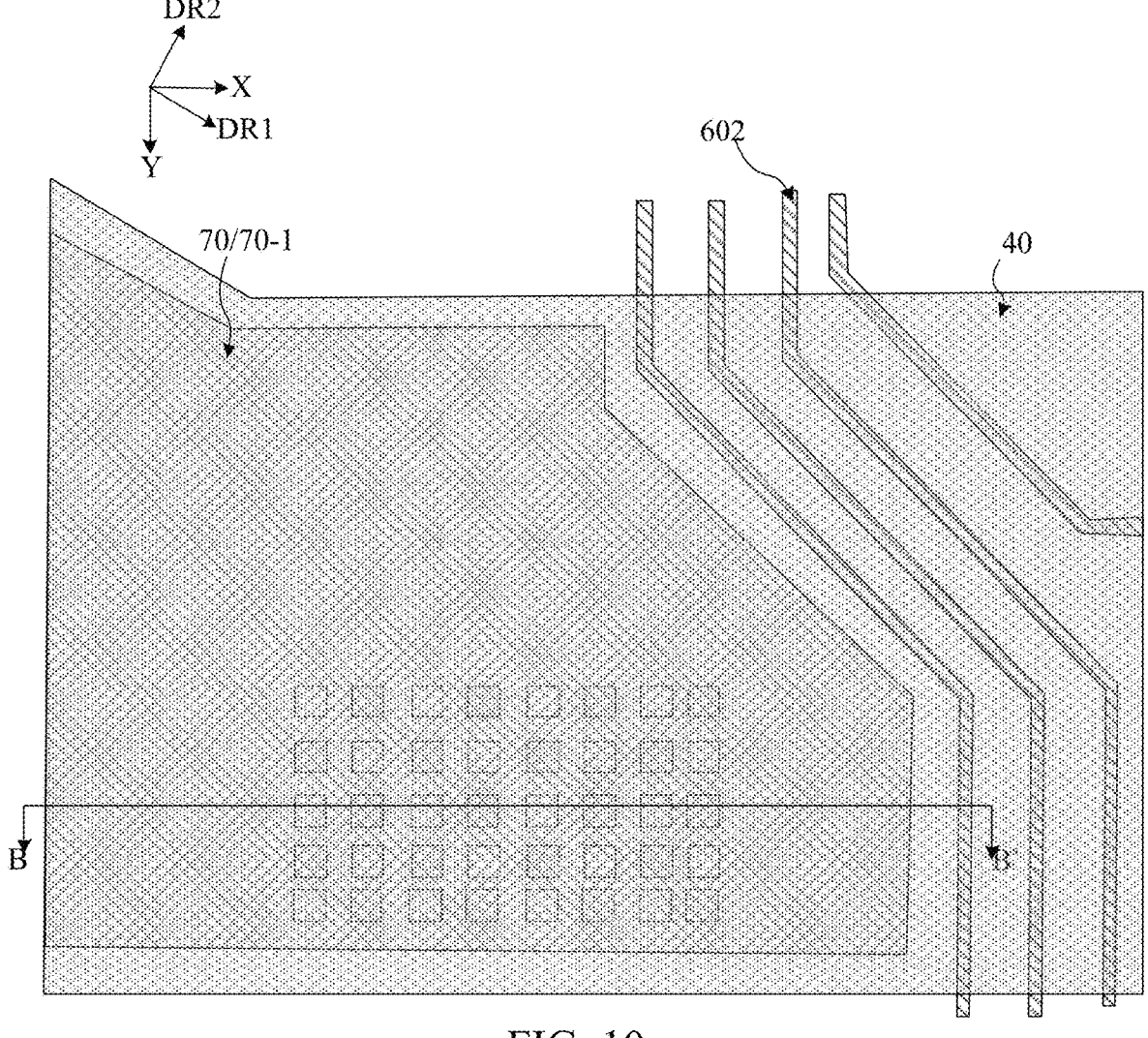
FIG. 10 is a schematic diagram of a second structure of a first trace region in a corner region of a display substrate in an exemplary embodiment of the present disclosure.
Figure 11:
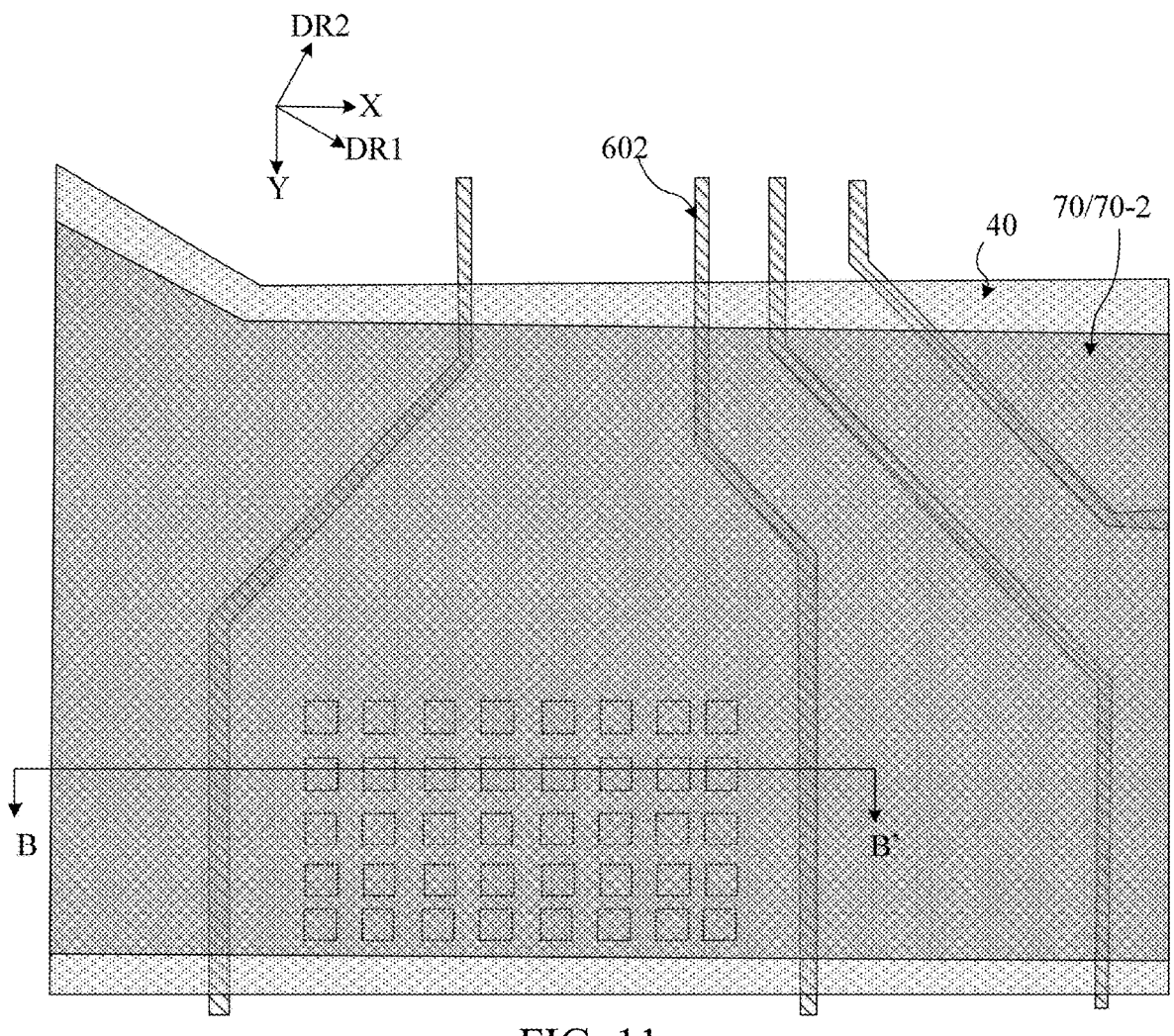
FIG. 11 is a schematic diagram of a third structure of a first trace region in a corner region of a display substrate in an exemplary embodiment of the present disclosure.
Figure 12:
FIG. 12 is a schematic diagram of a fourth structure of a first trace region in a corner region of a display substrate in an exemplary embodiment of the present disclosure.

FIG. 9 is a schematic diagram of a first structure of a first trace region in a corner region of a display substrate in an exemplary embodiment of the present disclosure. FIG. 10 is a schematic diagram of a second structure of a first trace region in a corner region of a display substrate in an exemplary embodiment of the present disclosure. FIG. 11 is a schematic diagram of a third structure of a first trace region in a corner region of a display substrate in an exemplary embodiment of the present disclosure. FIG. 12 is a schematic diagram of a fourth structure of a first trace region in a corner region of a display substrate in an exemplary embodiment of the present disclosure.

In an exemplary embodiment, as shown in FIG. 9 to FIG. 12, at least one corner region of the non-display region 200 may include: a composite circuit region, a first trace region, and a second trace region disposed sequentially in a direction away from the display region 100, the first trace region may include a power supply line 40 and at least one auxiliary electrode 70, an orthographic projection of the at least one auxiliary electrode 70 on the plane of the display substrate is overlapped with an orthographic projection of the power supply line 40 on the plane of the display substrate, and the at least one auxiliary electrode 70 is connected with the power supply line 40. Thus, in an embodiment of the present disclosure the auxiliary electrode is disposed in the first trace region and the power supply line 40 is connected with the auxiliary electrode 70, which can increase the VSS area of the power supply line 40, avoid the burn risk caused by an excessive local current due to the reduction of the VSS area, reduce the loading of the power supply line VSS, effectively alleviate the voltage drop (IR Drop), and ensure display uniformity.

Figure 13A:
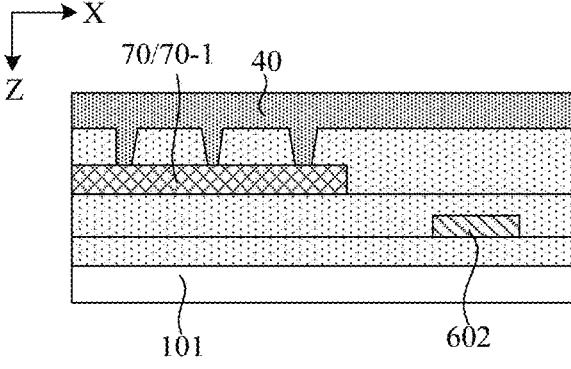
FIG. 13A is a schematic diagram of a cross-sectional view of structures along the BB' direction in FIG. 9 and FIG. 10.

In an exemplary embodiment, as shown in FIG. 9 to FIG. 12 and FIG. 13A to FIG. 13B, the at least one auxiliary electrode 70 is connected with the power supply line 40 through a via. Alternatively, as shown in FIG. 12 and FIG. 13B, the at least one auxiliary electrode 70 is connected directly with the power supply line 40 by a lapping manner. Here, no limitation is made thereto in embodiments of the present disclosure.

In an exemplary embodiment, as shown in FIG. 9 and FIG. 10, the first trace region may further include: multiple detection lead lines 602, an extension direction of the detection lead lines 602 intersects with an extension direction of the power supply line 40, an orthographic projection of the detection lead line 602 on the plane of the display substrate is not overlapped with an orthographic projection of the auxiliary electrode 70 on the plane of the display substrate, and the orthographic projection of the detection lead line 602 on the plane of the display substrate plane is overlapped with an orthographic projection of the power supply line 40 on the plane of the display substrate.

In an exemplary embodiment, as shown in FIG. 9, on a plane parallel to the display substrate, the auxiliary electrode 70 may include multiple sub-auxiliary electrodes, the multiple sub-auxiliary electrodes may be disposed at intervals along the extension direction of the power supply line, the multiple sub-auxiliary electrodes may include at least one of a first sub-auxiliary electrode 701, a second sub-auxiliary electrode 702, and a third sub-auxiliary electrode (not shown in figures). The first sub-auxiliary electrode is disposed on a side of the multiple detection lead lines 602 in an opposite direction of the first direction X, the second sub-auxiliary electrode 702 is disposed between the multiple detection lead lines 602, and the third sub-auxiliary electrode is disposed on a side of the multiple detection lead lines 602 in the first direction X.

In an exemplary embodiment, the shape of the sub-auxiliary electrode may be configured and adjusted according to a position of the detection lead line 602. For example, a shape of the sub-auxiliary electrode is similar to a shape of the spacing region between the detection wire lead lines 602, to achieve rational utilization of the wiring space.

In an exemplary embodiment, as shown in FIG. 10, on a plane parallel to the display substrate, the auxiliary electrode 70 may include multiple sub-auxiliary electrodes, the multiple sub-auxiliary electrodes may be sequentially connected and disposed along the extension direction of the power supply line 40, and the multiple sub-auxiliary electrodes are all disposed on a side of the multiple detection lead lines 602 in an opposite direction of the first direction X. Thus, the auxiliary electrodes 70 may be an entire electrode, which can effectively reduce the loading of the power supply line 40.

In an exemplary embodiment, FIG. 13A is a schematic diagram of a cross-sectional view of a structure along the BB' direction in FIG. 9 and FIG. 10, FIG. 13B is a schematic diagram of a cross-sectional view of a structure along the BB' direction in FIG. 11, and FIG. 13C is a schematic diagram of a cross-sectional view of a structure along the BB' direction in FIG. 12. As shown in FIG. 13A to FIG. 13C, the film layer on which the auxiliary electrode 70 is located, the film layer on which the detection lead line 602 is located, and the film layer on which the power supply line 40 is located may be located in different film layers.

In an exemplary embodiment, the auxiliary electrode 70 may include at least one of the first-type auxiliary electrode 70-1 and the second-type auxiliary electrode 70-2. In a direction perpendicular to the plane of the display substrate, the film layer on which the first-type auxiliary electrode is located may be located between the film layer on which the detection lead line 602 is located and the film layer on which the power supply line 40 is located, and the film layer on which the second-type auxiliary electrode is located may be located above the film layer on which the detection lead line 602 is located and the film layer on which the power supply line 40 is located.

In an exemplary embodiment, as shown in FIG. 13A, in a direction perpendicular to the plane of the display substrate, the display substrate may include a base substrate 101, and a first conductive layer, a second conductive layer, and a third conductive layer stacked on the base substrate 101, wherein the detection lead line 602 may be located on the first conductive layer, the first-type auxiliary electrode 70-1 may be located on the second conductive layer, and the power supply line 40 may be located on the third conductive layer. An insulation layer is disposed between adjacent conductive layers. For example, the detection lead line 602 and the gate electrode of the transistor in the ESD protection unit may be located in a same film layer. For example, the power supply line 40 and the first electrode and the second electrode of the transistor in the ESD protection unit may be located in a same film layer. For example, the film layer on which the first-type auxiliary electrode 70-1 is located may be located between the film layer on which the gate electrode of the transistor in the ESD protection unit is located and the film layer on which the first electrode and the second electrode of the transistor in the ESD protection unit are located. For example, the first conductive layer may be referred to as a first gate metal (Gate1) layer, the second conductive layer may be referred to as a second gate metal (Gate2) layer, and the third conductive layer may be referred to as a first source-drain metal (SD1) layer.

In an exemplary embodiment, as shown in FIG. 13B and FIG. 13C, in a direction perpendicular to the plane of the display substrate, the display substrate may include a base substrate 101, and a first conductive layer, a second conductive layer, a third conductive layer, and a fourth conductive layer that are sequentially stacked on the base substrate 101, wherein the detection lead line 602 may be located on the first conductive layer, the power supply line 40 may be located on the third conductive layer, and the second-type auxiliary electrode 70-2 may be located on the fourth conductive layer. An insulation layer is disposed between adjacent conductive layers. For example, the first conductive layer may be referred to as a first gate metal (Gate1) layer, the second conductive layer may be referred to as a second gate metal (Gate2) layer, the third conductive layer may be referred to as a first source-drain metal (SD1) layer, and the fourth conductive layer may be referred to as a second source-drain metal (SD2) layer.

In an exemplary embodiment, taking the display substrate employing a single source-drain (SD) metal layer as an example, the first-type auxiliary electrode 70-1 may be disposed to reduce the loading of the power supply line. For example, taking the display substrate employing a double source-drain (SD) metal layer as an example, the second-type auxiliary electrode 70-2 may be disposed to reduce the loading of the power supply line, or the first-type auxiliary electrode 70-1 and the second-type auxiliary electrode 70-2 may be disposed simultaneously to reduce the loading of the power supply line. Here, no limitation is made thereto in embodiments of the present disclosure.

Of course, shapes and film layers of the three, i.e., the electrostatic discharge protection line Signal, the first voltage signal line VGH, and the second voltage signal line VGL may adopt other implementations in which the wiring space can be reasonably utilized, in addition to the exemplary implementations listed above. For example, taking LTPO display products as an example, in addition to dividing the ESD protection circuit into multiple ESD protection units, multiple metal layers such as the first gate metal layer, the second gate metal (Gate2) layer, and the third gate metal (Gate3) layer may be alternately traced, so as to increase the wiring space of the first power supply line VSS. Here, no limitation is made thereto in embodiments of the present disclosure.

FIG. 14 is a schematic diagram of an equivalent circuit of an ESD protection unit in an exemplary embodiment of the present disclosure. As shown in FIG. 14, an ESD protection unit may include four transistors connected in series (a first transistor M1 to a fourth transistor M4). Herein a first electrode of the first transistor M1 is connected with a second voltage signal line VGL, a gate electrode of the first transistor M1 and a second electrode of the first transistor M1 are connected with the first electrode of the second transistor M2, a gate electrode of the second transistor M2, a second electrode of the second transistor M2, and a first electrode of the third transistor M3 are connected with the electrostatic discharge protection signal line Signal, a gate electrode of the third transistor M3, a second electrode of the third transistor M3 are connected with a first electrode of the fourth transistor M4, and a gate electrode of the fourth transistor M4 and a second electrode of the fourth transistor M4 are connected with the first voltage signal line VGH. Thus, the electrostatic discharge (ESD) protection unit may discharge electrostatic charges accumulated by the electrostatic discharge protection line Signal.

In an exemplary embodiment, a working principle of the electrostatic discharge protection unit shown in FIG. 14 is that: when positive charges accumulated by the electrostatic discharge protection line Signal meet a first condition, the electrostatic discharge protection line Signal will output a low voltage signal, so that the first transistor M1 and the second transistor M2 are turned on, causing the low voltage signal to be pulled up by the second voltage signal line VGL, thereby achieving elimination of static electricity; when negative charges accumulated by the electrostatic discharge protection line Signal meet a second condition, the electrostatic discharge protection line Signal will output a high voltage signal, so that the third transistor M3 and the fourth transistor M4 are turned on, causing the high voltage signal to be pulled down by the first voltage signal line VGH, thereby achieving elimination of static electricity. Herein, the first condition may refer to a minimum negative charge amount capable of causing the ESD protection unit to burn, and the second condition may refer to a minimum positive charge amount capable of causing the ESD protection unit to burn.

In an exemplary embodiment, the first transistor M1 to the fourth transistor M4 may be P-type transistors, or may be N-type transistors. Here, no limitation is made thereto in embodiments of the present disclosure.

Figure 15:
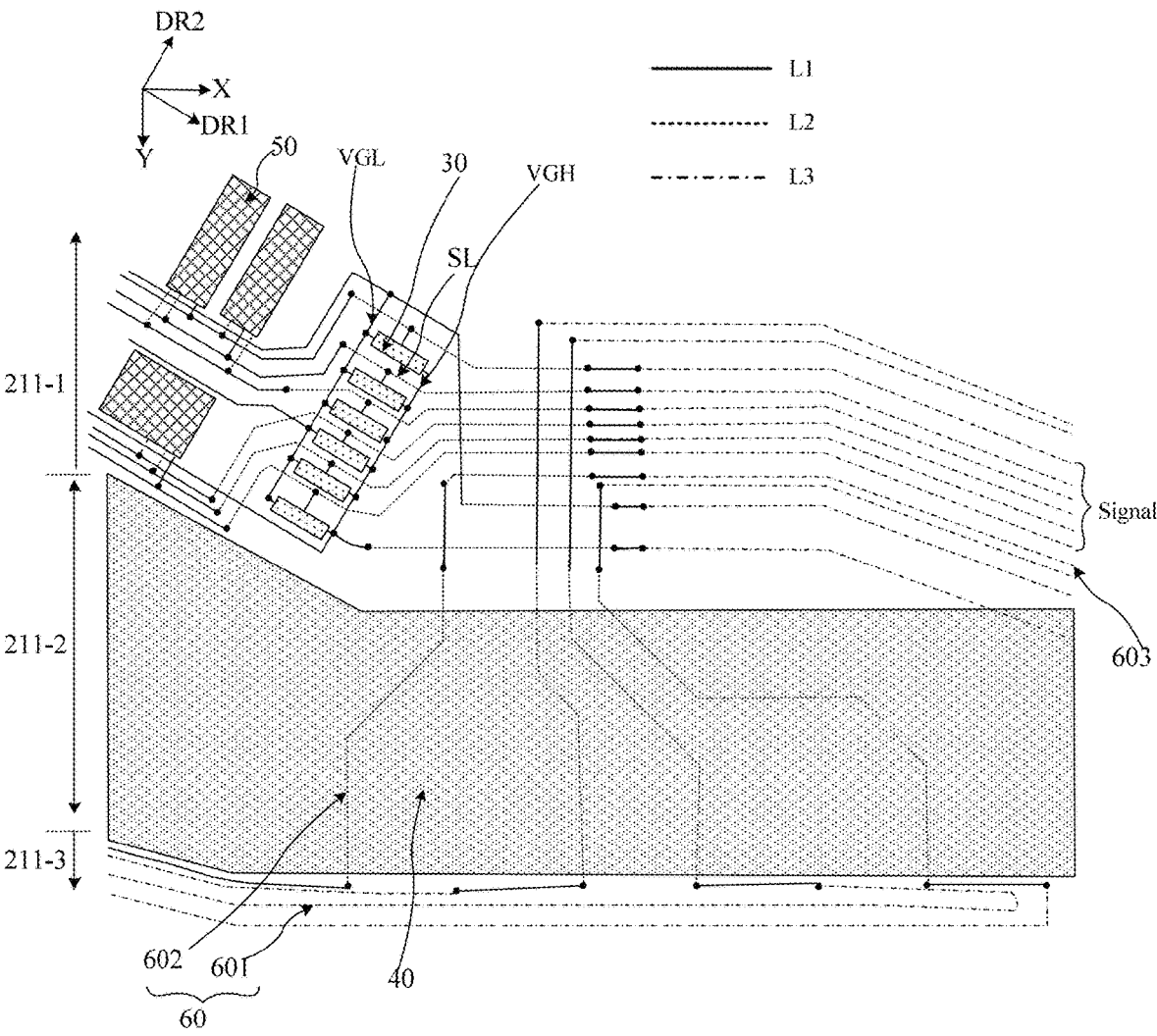
FIG. 15 is a schematic diagram of a first arrangement of a corner region of a display substrate in an exemplary embodiment of the present disclosure.
Figure 16:
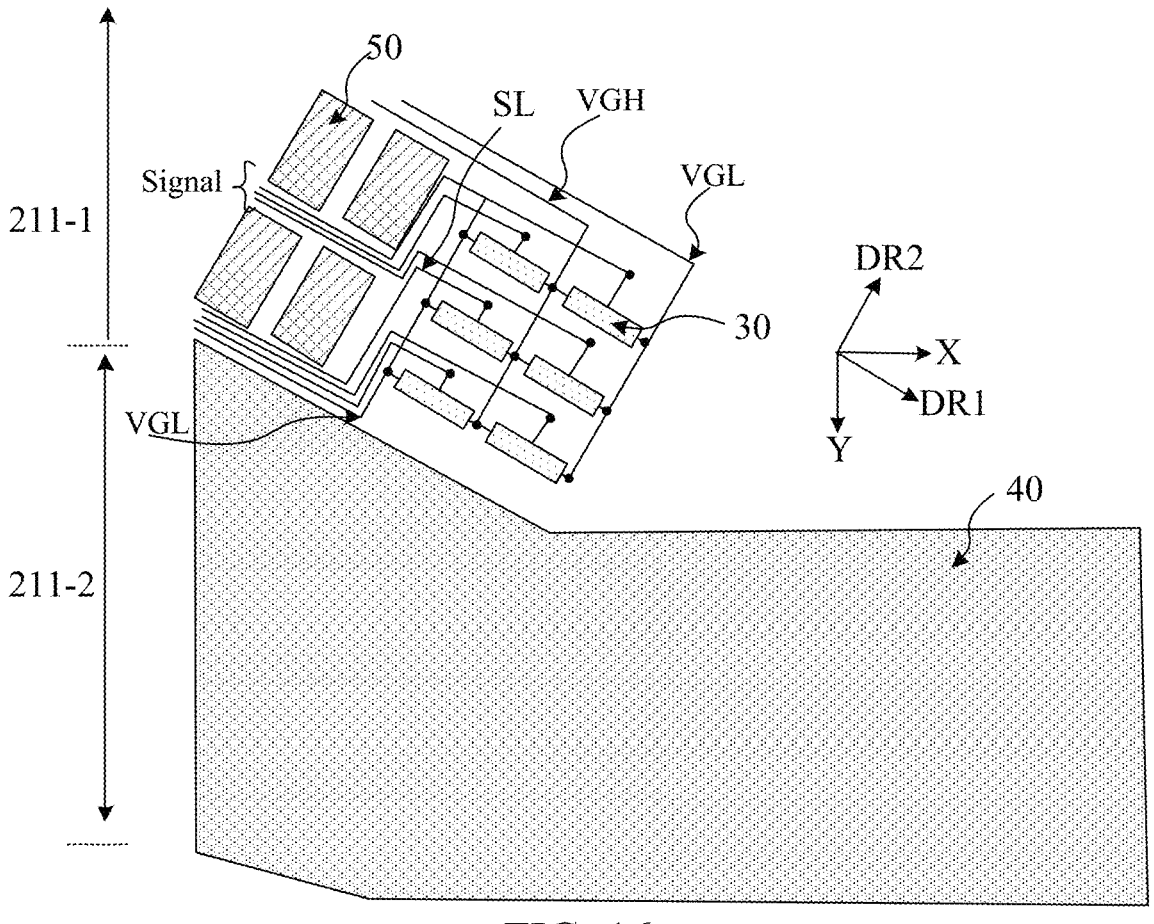
FIG. 16 is a schematic diagram of a second arrangement of a corner region of a display substrate in an exemplary embodiment of the present disclosure.

FIG. 15 is a schematic diagram of a first arrangement of a corner region of a display substrate in an exemplary embodiment of the present disclosure, and FIG. 16 is a schematic diagram of a second arrangement of a corner region of a display substrate in an exemplary embodiment of the present disclosure. Here, the ESD protection units, the traces, and the GOA units in FIG. 15 to FIG. 16 are only an exemplary illustration, and the number of the ESD protection units does not represent the actual number, an arrangement manner of the ESD protection units does not represent an actual arrangement manner, the number of the traces does not represent the actual number, and the shape of the traces does not represent an actual shape. Herein, FIG. 15 and FIG. 16 are illustrated by taking a case in which an ESD protection circuit of a display substrate includes six ESD protection units as an example.

In an exemplary embodiment, the display substrate may include at least one ESD protection circuit, the at least one ESD protection circuit may include multiple ESD protection units, at least one ESD protection unit may be disposed obliquely along the first inclined direction DR1. There is a first preset included angle between the first inclined direction DR1 and the first direction X, the first preset included angle is greater than 0° and less than 90°, for example, the first preset included angle may be about 10° to 80°, and the first direction X is an extension direction of the scan signal line in the display region.

Here, obliquely disposing the ESD protection unit along the first inclined direction DR1 may mean that an extension direction of the ESD protection unit is the first included direction DR1, multiple transistors in the ESD protection unit are arranged along the first inclined direction DR1, or active layers of the multiple transistors in the ESD protection unit are arranged along the first inclined direction DR1, etc.

In an exemplary embodiment, the multiple ESD protection units may be sequentially disposed along the second inclined direction DR2, or the multiple ESD protection units may be arranged in an array along the first inclined direction DR1 and the second inclined direction DR2, etc. Here, no limitation is made thereto in embodiments of the present disclosure.

In an exemplary embodiment, as shown in FIG. 15, the ESD protection circuit may include six ESD protection units, each ESD protection unit is disposed along a first inclined direction DR1, and six ESD protection units are sequentially disposed along a second inclined direction DR2. For example, in the second inclined direction DR2 the spacing between two adjacent ESD protection units may be equal or unequal. Here, no limitation is made thereto in embodiments of the present disclosure.

In an exemplary embodiment, as shown in FIG. 16, the ESD protection circuit may include six ESD protection units, and each ESD protection unit is disposed along a first inclined direction DR1. The ESD protection circuit may include three sub-regions sequentially disposed along the second inclined direction DR2, and in each sub-region, two ESD protection units are sequentially disposed along the first inclined direction DR1.

Of course, the arrangement manner of the multiple ESD protection units in the display substrate in an embodiment of the present disclosure may not be limited to the manners listed above, other manners in which the wiring space can be reasonably utilized may be employed. For example, a reasonable layout may be made according to a number of ESD protection units, a size of the composite circuit region 211-1 in the first inclined direction DR1, or a size of the composite circuit region 211-1 in the second inclined direction DR2. Here, no limitation is made thereto in embodiments of the present disclosure.

In an exemplary embodiment, as shown in FIG. 15 and FIG. 16, at least one electrostatic discharge protection line Signal with which the ESD protection circuit is connected may include a gap trace part SL disposed between two adjacent ESD protection units. In this way, the ESD protection circuit is divided into multiple ESD protection units, the ESD protection units are flexibly and obliquely disposed, and the ESD protection line Signal is disposed to trace from the gap between two adjacent ESD protection units, so that the trace layout optimization can be realized and the layout space can be more reasonably utilized. For example, the two adjacent ESD protection units may refer to two adjacent ESD protection units in the second inclined direction DR2. For example, the number of gap trace parts SL between the two adjacent ESD protection units may be one or more. For example, the numbers of gap trace parts SL between the two adjacent ESD protection units may be the same or different. The number and position of the gap trace parts SL can be set according to the overall arrangement of multiple ESD protection units in the ESD protection circuit. Here, no limitation is made thereto in embodiments of the present disclosure.

In an exemplary embodiment, an extension direction of the gap trace part SL, between the two adjacent ESD protection units, of the electrostatic discharge protection line Signal is parallel to an inclined direction of at least one of the adjacent two ESD protection units 30. For example, as shown in FIG. 15, taking a case in which each ESD protection unit in an ESD protection circuit is disposed along a first inclined direction DR1, and six ESD protection units in the ESD protection circuit are sequentially disposed along the second inclined direction DR2 as an example, six electrostatic discharge protection lines Signal are connected with the ESD protection circuit, a gap trace part SL of each of five electrostatic discharge protection lines Signal among the six electrostatic discharge protection lines Signal may be disposed in a gap between two adjacent ESD protection units 30, and the gap trace parts SL of five electrostatic discharge protection lines Signal among the six electrostatic discharge protection lines Signal may be disposed along the first inclined direction DR1. For example, as shown in FIG. 16, taking a case in which each ESD protection unit in an ESD protection circuit is disposed along a first inclined direction DR1, and six ESD protection units in the ESD protection circuit are arranged in an array along the second inclined direction DR2 and the first inclined direction DR1 as an example, six electrostatic discharge protection lines Signal are connected with the ESD protection circuit, a gap trace part SL of each of four electrostatic discharge protection lines Signal among the six electrostatic discharge protection lines Signal may be disposed in a gap between two adjacent ESD protection units 30, wherein the gap trace parts SL of two electrostatic discharge protection lines Signal may both pass through gaps between two adjacent ESD protection units 30 on a side close to the GOA unit 50. In this way, the ESD protection circuit is divided into multiple ESD protection units and the ESD protection units are flexibly and obliquely disposed, the electrostatic discharge protection line Signal is disposed to trace from the gap between two adjacent electrostatic discharge protection units and the inclined direction of the gap trace part SL of the electrostatic discharge protection line Signal is disposed according to the inclined direction of the ESD protection unit, which can realize the trace layout optimization, and can more reasonably utilize the layout space.

In an exemplary embodiment, as shown in FIG. 15, at least one of the electrostatic discharge protection line Signal, the first voltage signal line VGH, and the second voltage signal line VGL may include: a first trace L1 and a second trace L2, wherein the first trace L1 is disposed on a same layer as a first electrode and a second electrode of the transistor in ESD protection unit, and the second trace is disposed on a same layer as a gate electrode of the transistor in ESD protection unit.

In an exemplary embodiment, the first trace L1 may include at least one of a straight line and a broken line. For example, the first trace L1 of the first voltage signal line VGH may include a straight line segment or a broken line segment extending along the second inclined direction DR2. For example, the first trace L1 of the first voltage signal line VGH may include a straight line segment or a broken line segment extending along the first inclined direction DR1. For example, the first trace L1 of the second voltage signal line VGL may include a straight line segment extending along the second inclined direction DR2. For example, the first trace L1 of the second voltage signal line VGL may include a straight line segment extending along the first inclined direction DR1. For example, the first trace L1 of the electrostatic discharge protection line Signal may include a broken line segment extending along the first inclined direction DR1.

In an exemplary embodiment, the second trace L2 may include at least one of a straight line and a broken line. For example, the second trace L2 of the electrostatic discharge protection line Signal may at least include a straight line segment or a broken line segment extending along the first inclined direction DR1. For example, the second trace L2 of the electrostatic discharge protection line Signal may at least include a straight line segment or a broken line segment extending along the first direction X.

In an exemplary embodiment, at least one of the electrostatic discharge protection line Signal, the first voltage signal line VGH, and the second voltage signal line VGL may further include: a third trace L3, wherein a film layer on which the third trace L3 is located is located between a film layer on which the first trace L1 is located and a film layer on which the second trace L2 is located.

In an exemplary embodiment, the third trace L3 may include at least one of a straight line and a broken line. For example, the third trace L3 of the electrostatic discharge protection line Signal may include a trace part extending along the first direction X and a trace part extending along the third inclined direction DR3. There is a second preset included angle between the third inclined direction and the first direction X. For example, the second preset included angle may be different from the first preset included angle.

In an exemplary embodiment, a broken line may include at least one of a first broken line, a second broken line, and a third broken line. For example, the first broken line may include: a first sub-line extending along the first inclined direction DR1 and a second sub-line extending along the first direction X, wherein the first sub-line and the second sub-line are sequentially connected. For example, the second broken line may include: a third sub-line extending along the second inclined direction DR1, a fourth sub-line extending along the first inclined direction DR1, and a fifth sub-line extending along the first direction X, wherein the third sub-line, the fourth sub-line, and the fifth sub-line are sequentially connected. For example, the third broken line may include: a sixth sub-line extending along the first inclined direction DR1 and a seventh sub-line extending along the second direction Y, wherein the sixth sub-line and the seventh sub-line are sequentially connected, the second direction Y is an extension direction of the data signal line in the display region. For example, the fourth broken line may include: an eighth sub-line extending along the first direction X and a ninth sub-line extending along the third inclined direction DR3, wherein there is a second preset included angle between the third inclined direction DR3 and the first direction X. For example, the second preset included angle may be different from the first preset included angle. Of course, other broken lines may also be used, and here, no limitation is made thereto in embodiments of the present disclosure. Furthermore, a degree of the second preset included angle is related to a shape of an outer contour of a corner region of the display region, so the second preset included angle may be set according to a radian of an inverted rounded corner of an outer contour of the display region, as long as wiring space can be reasonably utilized and encroaching wiring space of other traces can be avoided.

Of course, linear shapes and film layers of the three, i.e., the electrostatic discharge protection line Signal, the first voltage signal line VGH, and the second voltage signal line VGL may adopt other implementations in which the wiring space can be reasonably utilized, in addition to the exemplary implementations listed above. For example, taking LTPO display products as an example, in addition to dividing the ESD protection circuit into multiple ESD protection units, multiple metal layers such as the first gate metal layer, the second gate metal (Gate2) layer, and the third gate metal (Gate3) layer may be alternately traced, so as to increase the wiring space of the first power supply line VSS. Here, no limitation is made thereto in embodiments of the present disclosure.

As shown in FIG. 15, the ESD protection circuit is divided into multiple ESD protection units 30, at least one ESD protection unit is disposed obliquely along the first inclined direction DR1, and multiple ESD protection units are sequentially disposed along the second inclined direction DR2, compared with the disposition of the ESD protection circuit as a whole in parallel along the first direction X in FIG. 2, wiring space occupied by the ESD protection circuit in the first direction X can be reduced, wiring space occupied by the ESD protection circuit can be reduced, and wiring space occupied by the connection line between the ESD protection unit and the GOA unit can be saved, and wiring space occupied by the ESD protection unit 30 in the second direction Y can be reduced, and encroaching wiring space of the first power supply line VSS can be avoided, and thus, narrowing of the line width of the first power supply line VSS can be avoided.

As shown in FIG. 15, in addition that the ESD protection unit 30 is obliquely disposed along the first inclined direction DR1, the extension direction of the clock signal line (i.e., the electrostatic discharge protection line Signal) connected with the last-stage GOA unit may be disposed to be the same as or approximately the same as the first inclined direction DR1, or, the extension direction of the last-stage GOA unit 50 is disposed to be the same or approximately the same as the second inclined direction DR2. In this way, the extension direction of the ESD protection circuit as a whole can be approximately or the same as the extension direction of the last-stage GOA unit, so that the ESD protection circuit as a whole is parallel to the last-stage GOA unit. Thus, wiring space occupied by the GOA unit of the last-stage in the GOA unit 50 in the first direction X and the second direction Y perpendicular to the first direction X can be reduced, thereby wiring space of the GOA unit can be reduced, wiring space occupied by the connection line between the GOA unit and the ESD protection unit can be more effectively saved, encroaching wiring space of other traces can be avoided, and uniformity and yield of a product can be effectively improved.

As can be seen from the above, compared with the arrangement manner shown in FIG. 2 in some techniques, an exemplary embodiment of the present disclosure employs the arrangement manner shown in FIG. 8. By dividing the ESD protection circuit into multiple ESD protection units and disposing the ESD protection units obliquely along the first inclined direction DR1, the ESD protection circuit as a whole can be parallel to the last-stage GOA unit, and utilization of a blank region shown in FIG. 2 can be achieved. Moreover, since the ESD protection unit is divided into multiple ESD protection units, the most suitable position can be selected for tracing the clock signal line of the GOA unit so as to maximize space utilization. For example, the trace of the clock signal line connected with the GOA unit can selectively pass through the spacing region between the ESD protection units, and the trace layout can be optimized. In this way, a line width of the local region Q2 of the first power supply line VSS may be increased by about 20% to 30% through the arrangement manner shown in FIG. 8, so that a current density of the first power supply line VSS can be reduced, burn risk of the first power supply line VSS can be reduced, and uniformity and yield of a product can be improved.

Exemplary description is made below through a process for preparing the ESD protection unit in display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a certain material on a base substrate through a process such as deposition, coating, etc. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern". "A and B are disposed in a same layer" described in the present disclosure refers to that A and B are formed simultaneously through a same patterning process.

In an exemplary embodiment, on a plane perpendicular to the display substrate, the display substrate may include a first insulation layer disposed on the base substrate, a semiconductor layer disposed on a side of the first insulation layer away from the base substrate, a second insulation layer disposed on a side of the semiconductor layer away from the base substrate, a first conductive layer disposed on a side of the second insulation layer away from the base substrate, a third insulation layer disposed on a side of the first conductive layer away from the base substrate, a second conductive layer disposed on a side of the third insulation layer away from the base substrate, and a third conductive layer disposed on a side of the second conductive layer away from the base substrate.

In an exemplary embodiment, the semiconductor layer may include active layers of multiple transistors in the ESD protection unit 30.

In an exemplary embodiment, the first conductive layer may include gate electrodes of the multiple transistors in the ESD protection unit 30. For example, the first conductive layer may further include the second trace L2 included by at least one of electrostatic discharge protection line Signal, the first voltage signal line VGH, and the second voltage signal line VGL.

In an exemplary embodiment, the second conductive layer may further include an auxiliary electrode 70. For example, the second conductive layer may further include the third trace L3 included by at least one of the electrostatic discharge protection line Signal, the first voltage signal line VGH, and the second voltage signal line VGL.

In an exemplary embodiment, the third conductive layer may include first electrodes of the multiple transistors in the ESD protection unit 30 and second electrodes of the multiple transistors in the ESD protection unit 30. For example, the third conductive layer may further include the first power supply line VSS, the first trace L1 included by at least one of the electrostatic discharge protection line Signal, the first voltage signal line VGH, and the second voltage signal line VGL.

In an exemplary embodiment, the second insulation layer, the third insulation layer, and the fourth insulation layer are provided with multiple vias, the multiple vias includes a first part of vias, a second part of vias, and a third part of vias, wherein the first part of vias exposes an active layer, so that the first electrodes and the second electrodes of the multiple transistors in the ESD protection unit 30 are respectively connected with the active layer through the vias; the second part of vias exposes the gate electrodes of the multiple transistors in the ESD protection unit 30, so that the second electrodes of the multiple transistors in the ESD protection unit 30 are connected with the gate electrodes through the vias; and the third part of vias exposes the second trace L2 of the electrostatic discharge protection line Signal to connect the ESD protection unit with the electrostatic discharge protection line Signal.

FIG. 17 to FIG. 19B are schematic diagrams of a preparation process of the display substrate shown in FIG. 8. FIG. 17 to FIG. 19B are illustrated by taking a layout structure of six ESD protection units of the display substrate as an example. By using the structure of the ESD protection unit shown in FIG. 14 and the structure of the corner region of the display substrate shown in FIG. 15 as references and in conjunction with FIG. 17 to FIG. 19B, the display substrate provided in an exemplary embodiment of the present disclosure is described.

In an exemplary embodiment, the preparation process of the display substrate may include the following acts.

(1) Forming a pattern of a semiconductor layer on a base substrate.

Figure 17:
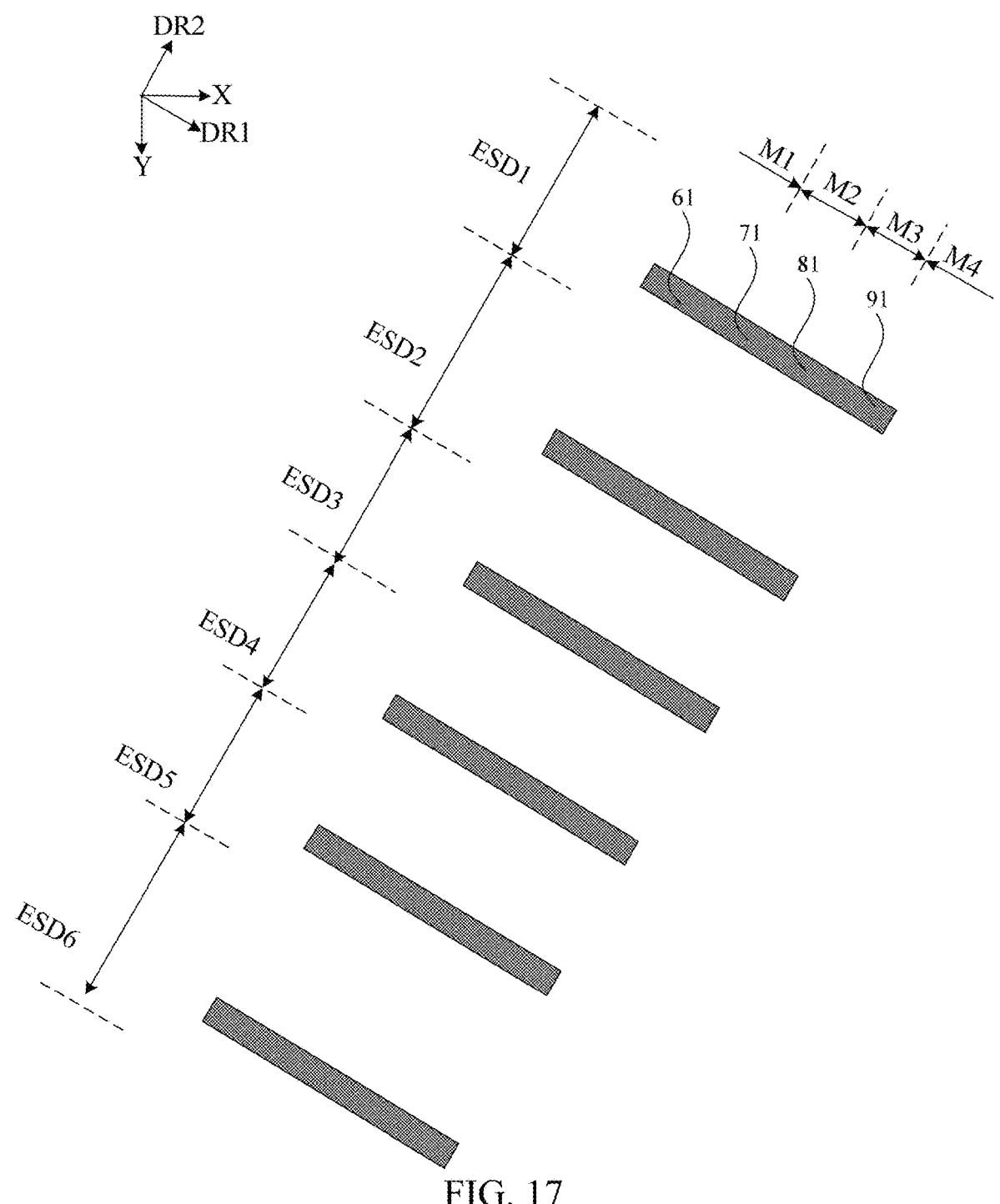
FIG. 17 is a schematic diagram of a structure after a semiconductor layer is formed in an exemplary embodiment of the present disclosure.

In an exemplary embodiment, forming the pattern of the semiconductor layer on the base substrate may include: a first insulation thin film and a semiconductor thin film are sequentially deposited on the base substrate, and the semiconductor thin film is patterned through a patterning process to form a first insulation layer that covers the whole base substrate, and the semiconductor layer disposed on the first insulation layer, as shown in FIG. 17.

In an exemplary embodiment, the first insulation layer may be called a Buffer layer, and the semiconductor layer may be called an Active (ACT) layer.

In an exemplary embodiment, as shown in FIG. 17, the semiconductor layer may include: active layers of multiple transistors in the ESD protection unit, for example, a first active layer 61 of a first transistor M1, a second active layer 71 of a second transistor M2, a third active layer 81 of a third transistor M3, and a fourth active layer 91 of a fourth transistor M4.

In an exemplary embodiment, as shown in FIG. 17, shapes of the first active layer 61, the second active layer 71, the third active layer 81, and the fourth active layer 91 may be strip shapes extending along the first inclined direction DR1. Thus, there is a first preset included angle between the first inclined direction DR1 and the first direction X, the first preset included angle may be about 10° to 80°, and the first direction X is an extension direction of the scan signal line in the display region.

In an exemplary embodiment, as shown in FIG. 17, the first active layer 61, the second active layer 71, the third active layer 81, and the fourth active layer 91 are sequentially disposed along the first inclined direction DR1, and flush in the second inclined direction DR2. Thus, the ESD unit may be obliquely arranged along the first inclined direction DR1.

In an exemplary embodiment, as shown in FIG. 17, active layers (for example, the first active layer 61 to the fourth active layer 91) of multiple transistors of ESD protection units may be an integrated structure connected with each other.

In an exemplary embodiment, an active layer of each transistor may include at least one channel region, and a first region and a second region located on two sides of the channel region. For example, the channel region may not be doped with an impurity, and has characteristics of a semiconductor. The first region and the second region may be disposed on two sides of the channel region and doped with impurities, and thus are conductive. The impurities may be changed according to a type of a transistor. In some examples, a doped region of the active layer may be interpreted as a source or a drain of a transistor. A part of the active layer between the transistors may be interpreted as a wiring doped with an impurity, and may be used for electrically connecting the transistor.

In an exemplary embodiment, as shown in FIG. 17, the first region of the first active layer 61 and the second region of the fourth active layer 91 may be separately disposed. The second region of the first active layer 61 may also serve as the first region of the second active layer 71, the second region of the second active layer 71 may also serve as the first region of the third active layer 81, and the second region of the third active layer 81 may also serve as the first region of the fourth active layer 91.

In an exemplary embodiment, the semiconductor layer may be made of a metal oxide material. For example, the metal oxide material may include, but is not limited to: an oxide containing indium and tin, an oxide containing tungsten and indium, an oxide containing tungsten, indium and zinc, an oxide containing titanium and indium, an oxide containing titanium, indium and tin, an oxide containing indium and zinc, an oxide containing silicon, indium and tin, or an oxide containing indium, gallium and zinc, etc. For example, the semiconductor layer may be made of a material, such as an amorphous indium gallium zinc oxide material (a-IGZO), zinc oxynitride (ZnON), indium zinc tin oxide (IZTO), amorphous silicon (a-Si), polycrystalline silicon (p-Si), sexithiophene or polythiophene, that is, the present disclosure is applicable to transistors manufactured based on oxide technology, silicon technology or organic technology. For example, the semiconductor layer may be a single layer, a double layer, or a multi-layer, etc. Here, no limitation is made thereto in embodiments of the present disclosure.

In an exemplary embodiment, the first insulation layer may employ any one or more of silicon oxide (SiOx), silicon nitride (SiNx), and silicon oxynitride (SiON), and may be a single layer, a multi-layer, or a composite layer.

(2) Forming a pattern of a first conductive layer.

Figure 18A:
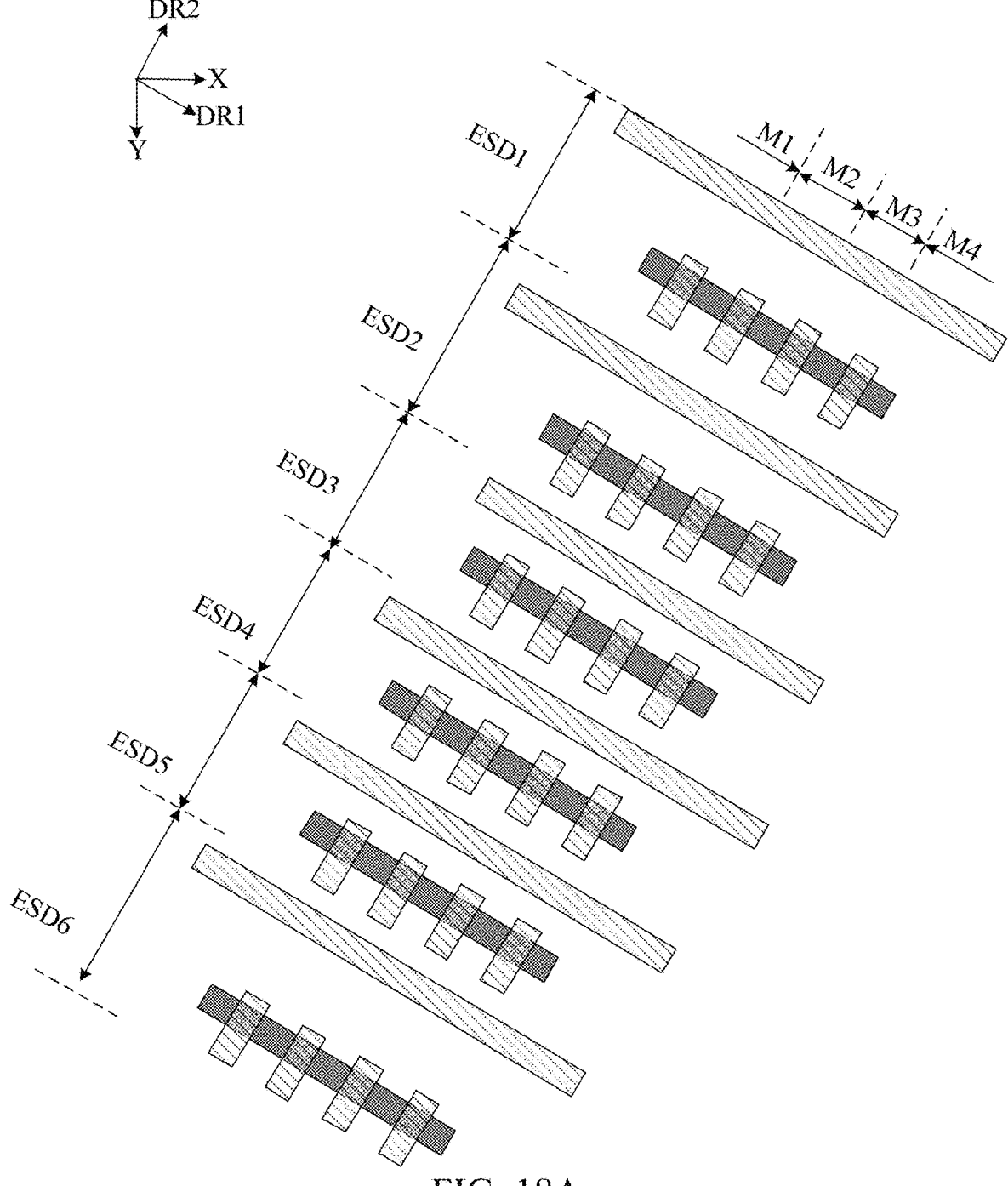
FIG. 18A is a schematic diagram of a structure after a first conductive layer is formed in an exemplary embodiment of the present disclosure.
Figure 18B:
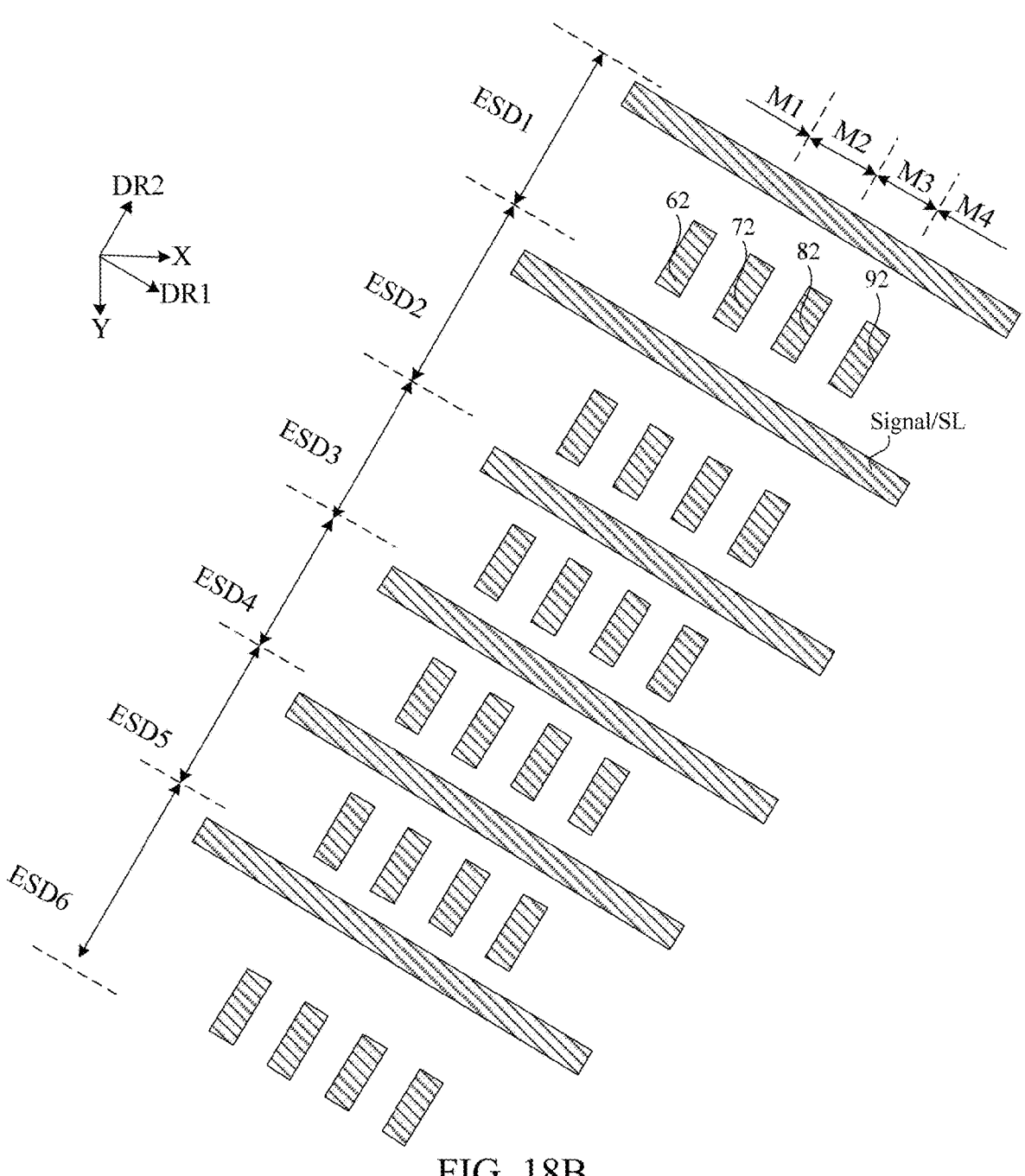
FIG. 18B is a schematic planar diagram of the first conductive layer in FIG. 18A.

In an exemplary embodiment, forming the pattern of the first conductive layer may include: depositing sequentially a second insulation thin film and a first metal thin film on the base substrate on which the aforementioned pattern is formed, and patterning the first metal thin film through a patterning process to form a second insulation layer that covers a pattern of the semiconductor layer and form the first conductive layer disposed on the second insulation layer, as shown in FIG. 18A and FIG. 18B, and FIG. 18B is a planar schematic diagram of the first conductive layer in FIG. 18A.

In an exemplary embodiment, the second insulation layer may be called a gate insulation (GI) layer and the first conductive layer may be called a first gate metal (Gate1) layer.

In an exemplary embodiment, as shown in FIG. 18A and FIG. 18B, the first conductive layer may include an electrostatic discharge protection line Signal, and gate electrodes of multiple transistors of the ESD protection unit, for example, a first gate electrode 62, a second gate electrode 72, a third gate electrode 82, and a fourth gate electrode 92.

In an exemplary embodiment, the first gate electrode 62 serves as the gate electrode of the first transistor M1, and an orthographic projection of the first gate electrode 62 on the base substrate is overlapped with an orthographic projection of the first active layer 61 on the base substrate. The second gate electrode 72 serves as the gate electrode of the second transistor M2, and an orthographic projection of the second gate electrode 72 on the base substrate is overlapped with an orthographic projection of the second active layer 71 on the base substrate. The third gate electrode 82 serves as the gate electrode of the third transistor M3, and an orthographic projection of the third gate electrode 82 on the base substrate is overlapped with an orthographic projection of the first active layer 81 on the base substrate. The fourth gate electrode 92 serves as the gate electrode of the fourth transistor M4, and an orthographic projection of the fourth gate electrode 92 on the base substrate is overlapped with an orthographic projection of the first active layer 91 on the base substrate.

In an exemplary embodiment, the first gate electrode 62, the second gate electrode 72, the third gate electrode 82, and the fourth gate electrode 92 may be sequentially disposed at intervals along the first inclined direction DR1, and flush in the second inclined direction DR2.

In an exemplary embodiment, the first gate electrode 62, the second gate electrode 72, the third gate electrode 82, and the fourth gate electrode 92 may be in the shape of a strip extending along the second inclined direction.

In an exemplary embodiment, the electrostatic discharge protection line Signal may be in the shape of a strip extending along the first inclined direction DR1 as a gap trace part SL of the electrostatic discharge protection line Signal. The gap trace part SL may be disposed between gate electrodes of multiple transistors of two adjacent ESD protection units. Multiple gap trace parts SL may be parallel with each other.

In an exemplary embodiment, the second insulation layer may employ any one or more of silicon oxide (SiOx), silicon nitride (SiNx), and silicon oxynitride (SiON), and may be a single layer, a multi-layer, or a composite layer.

In an exemplary embodiment, the first conductive layer may be made of a metal material. For example, the metal material may include, but is not limited to: any one or more of silver (Ag), copper (Cu), aluminum (Al), and molybdenum (Mo), or an alloy material of the metals listed above, such as aluminum-neodymium alloy (AlNd) or molybdenum-niobium alloy (MoNb), etc. For example, the second conductive layer may be a single-layer structure, or a multi-layer composite structure such as Mo/Cu/Mo or the like.

(3) Forming a pattern of a second conductive layer.

In an exemplary embodiment, forming a pattern of a second conductive layer may include: a third insulation thin film and a second metal thin film are sequentially deposited on the base substrate on which the aforementioned pattern is formed, and the second metal thin film is patterned by a patterning process to form a third insulation layer covering the first conductive layer, and the second conductive layer disposed on the third insulation layer, as shown in FIG. 9 and FIG. 10.

In an exemplary embodiment, the third insulation layer may be called an interlayer dielectric (ILD) layer, and the second conductive layer may be called a second gate metal (Gate2) layer.

In an exemplary embodiment, as shown in FIG. 15, the second conductive layer may include an auxiliary electrode 70.

In an exemplary embodiment, as shown in FIG. 15, the second conductive layer may further include the third trace L3 included by at least one of the electrostatic discharge protection line Signal, the first voltage signal line VGH, and the second voltage signal line VGL.

(4) Forming a pattern of a third conductive layer.

Figure 19A:
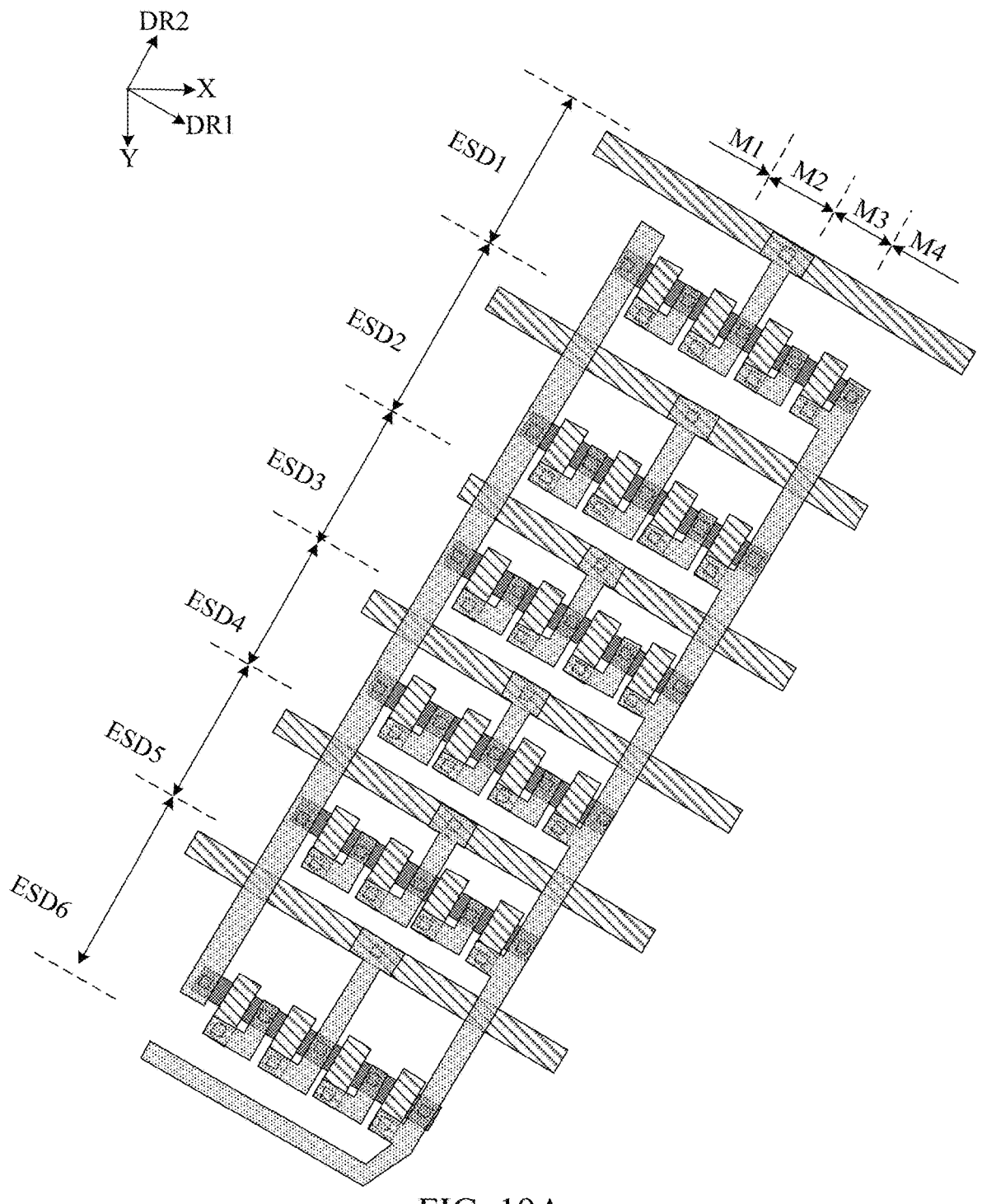
FIG. 19A is a schematic diagram of a structure after a third conductive layer is formed in an exemplary embodiment of the present disclosure.
Figure 19B:
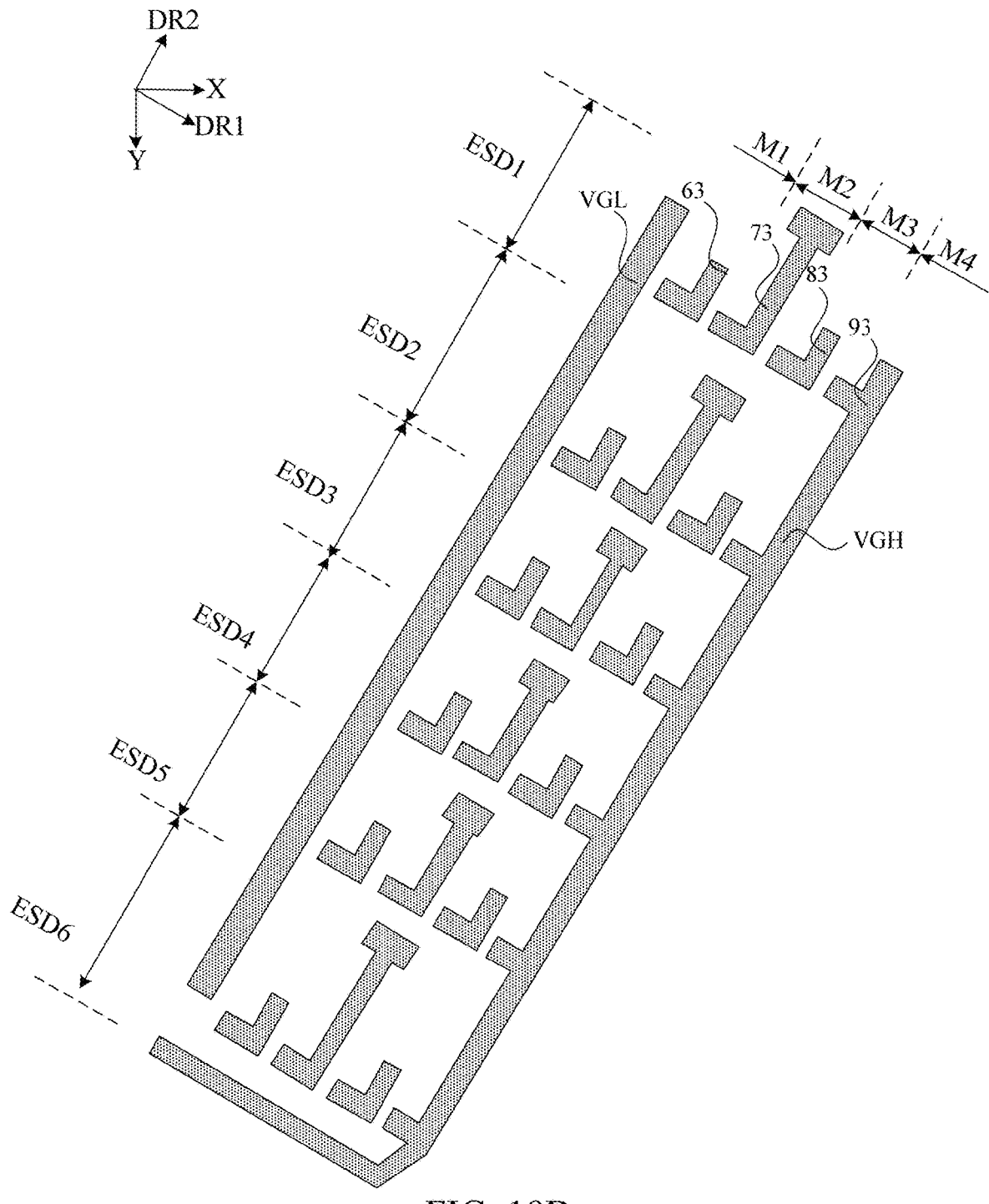
FIG. 19B is a schematic planar diagram of the third conductive layer in FIG. 19A.

In an exemplary embodiment, forming the pattern of the third conductive layer may include: depositing sequentially a fourth insulation thin film and a third metal thin film on the base substrate on which the aforementioned pattern is formed, and patterning the third metal thin film through a patterning process to form a fourth insulation layer covering the second conductive layer, and the third conductive layer disposed on the fourth insulation layer, as shown in FIG. 19A and FIG. 19B, and FIG. 19B is a planar schematic diagram of the third conductive layer in FIG. 19A.

In an exemplary embodiment, the fourth insulation layer may be called an interlayer dielectric (ILD) layer, and the third conductive layer may be called a first source-drain metal (SD1) layer.

In an exemplary embodiment, the fourth insulation layer may include multiple vias.

In an exemplary embodiment, the third conductive layer may include a first voltage signal line VGH, a second voltage signal line VGL, a first connection electrode 63, a second connection electrode 73, a third connection electrode 83, and a fourth connection electrode 93. As shown in FIG. 9 and FIG. 10, the third conductive layer may further include a power supply electrode 40.

In an exemplary embodiment, a shape of the second voltage signal line VGL may be a strip shape extending along the second inclined direction. An orthographic projection of the second voltage signal line VGL on the base substrate is overlapped with an orthographic projection of a first region of a first active layer 61 on the base substrate. The second voltage signal line VGL is connected with the first region of the first active layer 61 through a via. The second voltage signal line VGL may also serve as the first electrode of the first transistor M1.

In an exemplary embodiment, the first connection electrode 63 may also serve as the second electrode of the first transistor M1 and the first electrode of the second transistor M2. The shape of the first connection electrode 63 may be an "L" shape, one end of the first connection electrode 63 is connected with a second region of the first active layer 61 through a via, and another end of the first connection electrode 63 is connected with the first gate electrode 62 through a via, to achieve a connection of the gate electrode of the first transistor M1 and the second electrode of the first transistor M1.

In an exemplary embodiment, the second connection electrode 73 may also serve as the second electrode of the second transistor M2 and the first electrode of the third transistor M3. A shape of the second connection electrode 73 may be an "L" shape. An orthographic projection of the second connection electrode 73 on the base substrate is overlapped with each of an orthographic projection of the second gate electrode 72, an orthographic projection of the second region of the second active layer 71, an orthographic projection of the first region of the third active layer 81 and an orthographic projection of the electrostatic discharge protection line Signal on the base substrate. The first end of the second connection electrode 73 is connected with the second gate electrode 72 through a via, a second end of the second connection electrode 73 is connected with an electrostatic discharge protection line Signal through a via, the middle part of the second connection electrode 73 is connected with the second region of the second active layer 71 and the first region of the third active layer 81 through a via, so that the gate electrode of the second transistor M2, the second electrode of the second transistor M2, and the first electrode of the third transistor M3 may be connected with the electrostatic discharge protection line Signal.

In an exemplary embodiment, the third connection electrode 83 may also serve as the second electrode of the third transistor M3 and the first electrode of the fourth transistor M4. A shape of the third connection electrode 83 may be an "L" shape. One end of the third connection electrode 83 is connected with a second region of the third active layer 81 and a first region of the fourth active layer 91, and another end of the third connection electrode 83 is connected with the third gate electrode 82, to achieve a connection of the second electrode of the third transistor M3, the gate electrode of the third transistor M3, and the first electrode of the fourth transistor M4.

In an exemplary embodiment, the fourth connection electrode 93 serves as the second electrode of the fourth transistor M4. A shape of the fourth connection electrode 93 may be an "L" shape. One end of the fourth connection electrode 93 is connected with a second region of the fourth active layer 91, and another end of the fourth connection electrode 93 is connected with the fourth gate electrode 92, to achieve a connection of the gate electrode of the fourth transistor M4 and the second electrode of the fourth transistor M4.

In an exemplary embodiment, the fourth connection electrode 93 and the first voltage signal line VGH may be an integrated structure connected with each other, and a connection of the gate electrode of the fourth transistor M4, the second electrode of the fourth transistor M4, and the first voltage signal line VGH may be achieved.

In an exemplary embodiment, the third conductive layer may be made of a metal material. For example, the metal material may include, but is not limited to: any one or more of silver (Ag), copper (Cu), aluminum (Al), and molybdenum (Mo), or an alloy material of the metals listed above, such as aluminum-neodymium alloy (AlNd) or molybdenum-niobium alloy (MoNb), etc. The third conductive layer may be a single-layer structure, or a multi-layer composite structure such as Mo/Cu/Mo or the like.

So far, the process for preparing the ESD protection unit is completed.

Thus, in an exemplary embodiment of the present disclosure, by dividing ESD protection circuit into multiple ESD protection units, disposing the four transistors in the ESD protection unit 30 obliquely along the first inclined direction DR1, so that the ESD protection unit is obliquely disposed along the first inclined direction DR1, in this way, compared with the disposition of the ESD protection circuit as a whole horizontally along the first direction X, reasonably utilization of wiring space can be achieved, encroaching wiring space of other traces can be avoided and uniformity and yield of a product can be improved. Here, a degree of the first preset included angle is related to a shape of an outer contour of a corner region of the display region, and a shape of the inner contour of the trace part of the power supply line located in the corner region, so the first preset included angle may be set according to a radian of an inverted rounded corner of an outer contour of the display region, as long as wiring space can be reasonably utilized and encroaching wiring space of other traces can be avoided.

An embodiment of the present disclosure also provides a display apparatus. The display apparatus may include: the display substrate in one or more of the above exemplary embodiments.

In an exemplary embodiment, the display apparatus may include, but is not limited to, a Thin Film Transistor-Liquid Crystal Display (TFT-LCD) display apparatus or an Active Matrix Organic Light Emitting Diode (AMOLED) display apparatus, etc. Here, no limitation is made thereto in embodiments of the present disclosure.

In an exemplary embodiment, the display apparatus may include, but is not limited to, any product or component having a display function such as a mobile phone, a tablet computer, a television, a display, a notebook computer, a digital photo bezel, or a navigator. Here, no limitation is made thereto in embodiments of the present disclosure.

The above descriptions in embodiments of the display apparatus are similar to the above descriptions in embodiments of the display substrate, and the embodiments of the display apparatus have similar beneficial effects as the embodiments of the display substrate. Technical details undisclosed in the embodiments of the display apparatus of the present disclosure may be understood by those skilled in the art with reference to the descriptions in the embodiments of the display substrate of the present disclosure, which will not be repeated here.

Although implementations of the present disclosure are disclosed above, the above contents are only implementations for easily understanding the present disclosure and not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined by the appended claims.

The invention claimed is:

1. A display substrate, comprising: a display region, and a non-display region located on a periphery of the display region, wherein the non-display region comprises a composite circuit region, and a first trace region located on a side of the composite circuit region away from the display region;

the composite circuit region comprises an electrostatic discharge protection circuit, the electrostatic discharge protection circuit comprises a plurality of electrostatic discharge protection units, at least one electrostatic discharge protection unit in the plurality of electrostatic discharge protection units extends along a first inclined direction, there is a first preset included angle between the first inclined direction and a first direction, the first preset included angle is greater than 0° and less than 90°, and the first direction is an extension direction of a scan signal line in the display region;

the first trace region comprises a power supply line and at least one auxiliary electrode, an orthographic projection of the at least one auxiliary electrode on a plane of the display substrate is overlapped with an orthographic projection of the power supply line on the plane of the display substrate, and the at least one auxiliary electrode is connected with the power supply line;

wherein the non-display region further comprises a second trace region located on a side of the first trace region away from the display region, the non-display region further comprises a plurality of crack detection lines, a crack detection line is configured to detect a crack, the crack detection line comprises a detection connection line located in the composite circuit region, a detection lead line located in the first trace region, and a detection extension line located in the second trace region, which are sequentially connected.

2. The display substrate according to claim 1, wherein the non-display region comprises: a first voltage signal line, a second voltage signal line, and an electrostatic discharge protection line, each electrostatic discharge protection unit comprises at least two transistors in series, a first electrode of each transistor is connected with a gate electrode, the first voltage signal line is connected with a transistor at one end of the electrostatic discharge protection unit, the second voltage signal line is connected with another transistor at the other end of the electrostatic discharge protection unit, the electrostatic discharge protection line is connected with any one connection node located between the one transistor and the another transistor, and the electrostatic discharge protection unit is configured to discharge electrostatic charges accumulated on the electrostatic discharge protection line.

3. The display substrate according to claim 1, wherein the auxiliary electrode comprises a plurality of sub-auxiliary electrodes, which are sequentially and continuously disposed along an extension direction of the power supply line, and the plurality of sub-auxiliary electrodes are all disposed on a side of the detection lead line.

4. The display substrate according to claim 1, wherein the auxiliary electrode comprises a plurality of sub-auxiliary electrodes, the plurality of sub-auxiliary electrodes are sequentially disposed at intervals along an extension direction of the power supply line, the plurality of sub-auxiliary electrodes comprise at least one of the first sub-auxiliary electrode, the second sub-auxiliary electrode, and the third sub-auxiliary electrode, the first sub-auxiliary electrode is disposed on a side of the detection lead line in an opposite direction of the first direction, the second sub-auxiliary electrode is disposed between detection lead lines, and the third sub-auxiliary electrode is disposed on a side of the detection lead line in the first direction.

5. The display substrate according to claim 1, wherein the power supply line is located in the first trace region, an extension direction of the detection lead line intersects with an extension direction of the power supply line, and a film layer on which the auxiliary electrode is located, a film layer on which the detection lead line is located, and a film layer on which the power supply line is located, are located in different film layers.

6. The display substrate according to claim 5, wherein the auxiliary electrode comprises at least one of a first-type auxiliary electrode and a second-type auxiliary electrode, in a direction perpendicular to the plane of the display substrate, a film layer on which the first-type auxiliary electrode is located is between the film layer on which the detection lead line is located and the film layer on which the power supply line is located, and a film layer on which the second-type auxiliary electrode is located is on a side of the power supply line away from the film layer on which detection lead line is located.

7. The display substrate according to claim 6, wherein an orthographic projection of the detection lead line on the plane of the display substrate is not overlapped with an orthographic projection of the first-type auxiliary electrode on the plane of the display substrate, and the orthographic projection of the detection lead line on the plane of the display substrate is overlapped with an orthographic projection of the second-type auxiliary electrode on the plane of the display substrate.

8. The display substrate according to claim 6, wherein in the direction perpendicular to the plane of the display substrate, the display substrate comprises a semiconductor layer, a first conductive layer, a second conductive layer, and a third conductive layer which are sequentially disposed on a base substrate;

the semiconductor layer comprises active layers of at least two transistors;

the first conductive layer comprises gate electrodes of the at least two transistors, and the detection lead line, the second conductive layer comprises the first-type auxiliary electrode;

the third conductive layer comprises first electrodes of the at least two transistors, second electrodes of the at least two transistors, and the power supply line.

9. The display substrate according to claim 8, wherein the display substrate further comprises a fourth conductive layer disposed on a side of the third conductive layer away from the base substrate, and the fourth conductive layer comprises the second-type auxiliary electrode.

10. The display substrate according to claim 1, wherein the at least one electrostatic discharge protection unit extending along the first inclined direction comprises the at least two transistors in the at least one electrostatic discharge protection unit are sequentially disposed along the first inclined direction.

11. The display substrate according to claim 1, wherein the plurality of electrostatic discharge protection units are sequentially disposed along a second inclined direction, or the plurality of electrostatic discharge protection units are arranged in an array along the first inclined direction and the second inclined direction, and the second inclined direction intersects with the first inclined direction.

12. The display substrate according to claim 2, wherein at least one of electrostatic discharge protection lines comprises a gap trace part disposed between two adjacent electrostatic discharge protection units.

13. The display substrate according to claim 12, wherein an extension direction of the gap trace part is parallel to an inclined direction of at least one of the adjacent two electrostatic discharge protection units.

14. The display substrate according to claim 2, wherein at least one of the electrostatic discharge protection line, the first voltage signal line, and the second voltage signal line comprises a first trace and a second trace, wherein the first trace is disposed on a same layer as first electrodes of transistors and second electrodes of the transistors in the electrostatic discharge protection unit, and the second trace is disposed on a same layer as gate electrodes of the transistors in the electrostatic discharge protection unit.

15. The display substrate according to claim 14, wherein at least one of the electrostatic discharge protection line, the first voltage signal line, and the second voltage signal line further comprises a third trace, wherein a film layer on which the third trace is located is located between a film layer on which the first trace is located and a film layer on which the second trace is located.

16. The display substrate according to claim 2, wherein the composite circuit region further comprises an Gate Driver on Array (GOA) circuit, the GOA circuit comprises a plurality of GOA units, and at least one GOA unit in the GOA units is connected with the electrostatic discharge protection line.

17. A display substrate, comprising: a display region, and a non-display region located on a periphery of the display region, wherein the non-display region comprises a composite circuit region, and a first trace region located on a side of the composite circuit region away from the display region;

the composite circuit region comprises an electrostatic discharge protection circuit, the electrostatic discharge protection circuit comprises a plurality of electrostatic discharge protection units, at least one electrostatic discharge protection unit in the plurality of electrostatic discharge protection units extends along a first inclined direction, there is a first preset included angle between the first inclined direction and a first direction, the first preset included angle is greater than 0° and less than 90°, and the first direction is an extension direction of a scan signal line in the display region;

the first trace region comprises a power supply line and at least one auxiliary electrode, an orthographic projection of the at least one auxiliary electrode on a plane of the display substrate is overlapped with an orthographic projection of the power supply line on the plane of the display substrate, and the at least one auxiliary electrode is connected with the power supply line;

wherein the non-display region comprises: a first bezel region and a second bezel region disposed oppositely in a second direction, a third bezel region and a fourth bezel region disposed oppositely in the first direction, a first corner region connecting the first bezel region and the third bezel region, a second corner region connecting the first bezel region and the fourth bezel region, a third corner region connecting the second bezel region and the third bezel region, and a fourth corner region connecting the second bezel region and the fourth bezel region, wherein at least one of the first corner region to the fourth corner region is an arc-shaped corner region, the electrostatic discharge protection unit and the auxiliary electrode are located in the arc-shaped corner region, and the second direction is an extension direction of a data signal line in the display region.

18. A display substrate, comprising: a display region, and a non-display region located on a periphery of the display region, wherein the non-display region comprises a composite circuit region, and a first trace region located on a side of the composite circuit region away from the display region;

the composite circuit region comprises an electrostatic discharge protection circuit, the electrostatic discharge protection circuit comprises a plurality of electrostatic discharge protection units, at least one electrostatic discharge protection unit in the plurality of electrostatic discharge protection units extends along a first inclined direction, there is a first preset included angle between the first inclined direction and a first direction, the first preset included angle is greater than 0° and less than 90°, and the first direction is an extension direction of a scan signal line in the display region;

the first trace region comprises a power supply line and at least one auxiliary electrode, an orthographic projection of the at least one auxiliary electrode on a plane of the display substrate is overlapped with an orthographic projection of the power supply line on the plane of the display substrate, and the at least one auxiliary electrode is connected with the power supply line;

wherein that the at least one auxiliary electrode is connected with the power supply line, comprises: the at least one auxiliary electrode is connected with the power supply line through a via, or the at least one auxiliary electrode is directly lapped with the power supply line.

19. A display apparatus, comprising: the display substrate according to claim 1.

20. A display apparatus, comprising: the display substrate according to claim 17.

\* \* \* \* \*